US012604761B2

(12) United States Patent
Xia et al.

(10) Patent No.: US 12,604,761 B2
(45) Date of Patent: Apr. 14, 2026

(54) LED DISPLAY PANEL AND DISPLAY DEVICE WITH GROOVE IN NON-DISPLAY REGION

(71) Applicant: Shanghai Tianma Micro-electronics Co., Ltd., Shanghai (CN)

(72) Inventors: Xingda Xia, Shanghai (CN); Jujian Fu, Shanghai (CN); Xiao Chi, Shanghai (CN); Yuqi Hu, Shanghai (CN)

(73) Assignee: Shanghai Tianma Micro-electronics Co., Ltd., Shanghai (CN)

( * ) Notice: Subject to any disclaimer, the term of this patent is extended or adjusted under 35 U.S.C. 154(b) by 112 days.

(21) Appl. No.: 17/379,816

(22) Filed: Jul. 19, 2021

(65) Prior Publication Data

US 2022/0367432 A1 Nov. 17, 2022

(30) Foreign Application Priority Data

Apr. 30, 2021 (CN) .......................... 202110481993.9

(51) Int. Cl.
| | |
|---|---|
| *H01L 25/16* | (2023.01) |
| *G02F 1/1333* | (2006.01) |
| *G02F 1/1362* | (2006.01) |
| *G02F 1/16756* | (2019.01) |
| *H10D 86/40* | (2025.01) |
| *H10D 86/60* | (2025.01) |

(52) U.S. Cl.
CPC ...... *H01L 25/167* (2013.01); *G02F 1/133345* (2013.01); *G02F 1/136227* (2013.01); *G02F 1/16756* (2019.01); *H10D 86/441* (2025.01); *H10D 86/451* (2025.01); *H10D 86/60* (2025.01)

(58) Field of Classification Search
CPC ........................ G09G 2300/04; H01L 27/1248
See application file for complete search history.

(56) References Cited

U.S. PATENT DOCUMENTS

| | | | | |
|---|---|---|---|---|
| 2003/0128329 A1* | 7/2003 | Kim | .................. | G02F 1/133553 |
| | | | | 349/138 |
| 2004/0135952 A1* | 7/2004 | Kurashina | ......... | G02F 1/136227 |
| | | | | 349/110 |
| 2011/0001146 A1 | 1/2011 | Yamazaki et al. | | |
| 2018/0149807 A1* | 5/2018 | Seo | .................. | G02F 1/133615 |
| 2018/0308871 A1* | 10/2018 | Wu | .................... | H10D 30/6746 |
| 2019/0019966 A1* | 1/2019 | Jiang | .................... | H10K 77/111 |
| 2019/0081085 A1* | 3/2019 | Ozeki | .................. | G02F 1/1368 |

FOREIGN PATENT DOCUMENTS

| | | | | |
|---|---|---|---|---|
| CN | 1499277 A | 5/2004 | | |
| CN | 1735292 A | 2/2006 | | |
| CN | 107293593 A | 10/2017 | | |
| CN | 108022940 A | 5/2018 | | |
| CN | 109148489 A | 1/2019 | | |
| CN | 109830181 A | 5/2019 | | |
| EP | 3-316301 | * 10/2017 | ............. | H01L 25/16 |

* cited by examiner

*Primary Examiner* — Lauren Nguyen
(74) *Attorney, Agent, or Firm* — Anova Law Group, PLLC

(57) ABSTRACT

A light-emitting diode (LED) display panel and a display device are provided. The LED display panel includes a substrate, an array layer at a side of the substrate, and a light-emitting device at a side of the array layer away from the substrate. The array layer includes an insulating layer and a driving device; the insulating layer includes a groove; the groove is between an edge of the display panel and the driving device; and/or the groove is between the light-emitting device and the driving device.

17 Claims, 19 Drawing Sheets

LED DISPLAY PANEL AND DISPLAY DEVICE WITH GROOVE IN NON-DISPLAY REGION

CROSS-REFERENCE TO RELATED APPLICATION

This application claims the priority of Chinese Patent Application No. 202110481993.9, filed on Apr. 30, 2021, the content of which is incorporated herein by reference in its entirety.

TECHNICAL FIELD

The present disclosure generally relates to the field of display technology and, more particularly, relates to an LED display panel and a display device.

BACKGROUND

Flat display devices have become the mainstream in display devices and are widely used in various consumer electronics such as mobile phones, TVs, personal digital assistants, digital cameras, notebook computers, desktop computers and the like due to their advantages of high image quality, power saving, thin body, wide application range and the like.

A light-emitting diode (LED) display panel is a display that uses an LED array integrated on a substrate as display pixels to implement image display. Each LED pixel can be specifically addressed and individually driven to emit light. Compared with organic light-emitting diode (OLED) displays, the LED displays may have the advantages of better material stability, longer lifetime, no image burn-in and the like, such that the LED displays may be considered to be the biggest competitor of the OLED displays.

SUMMARY

One aspect of the present disclosure provides a light-emitting diode (LED) display panel. The LED display panel includes a substrate, an array layer at a side of the substrate, and a light-emitting device at a side of the array layer away from the substrate. The array layer includes an insulating layer and a driving device; the insulating layer includes a groove; the groove is between an edge of the display panel and the driving device; and/or the groove is between the light-emitting device and the driving device.

Another aspect of the present disclosure provides a display device including a LED display panel. The LED display panel includes a substrate, an array layer at a side of the substrate, and a light-emitting device at a side of the array layer away from the substrate. The array layer includes an insulating layer and a driving device; the insulating layer includes a groove; the groove is between an edge of the display panel and the driving device; and/or the groove is between the light-emitting device and the driving device.

Other aspects of the present disclosure can be understood by those skilled in the art in light of the description, the claims, and the drawings of the present disclosure.

BRIEF DESCRIPTION OF THE DRAWINGS

In order to more clearly explain embodiments of the present disclosure or the technical solutions in the existing technology, the drawings required for describing the embodiments or the existing technology are briefly introduced hereinafter. Obviously, the drawings in the following description are merely embodiments of the present disclosure. Other drawings may also be obtained by those skilled in the art without any creative work according to provided drawings.

DETAILED DESCRIPTION

Figure 1:
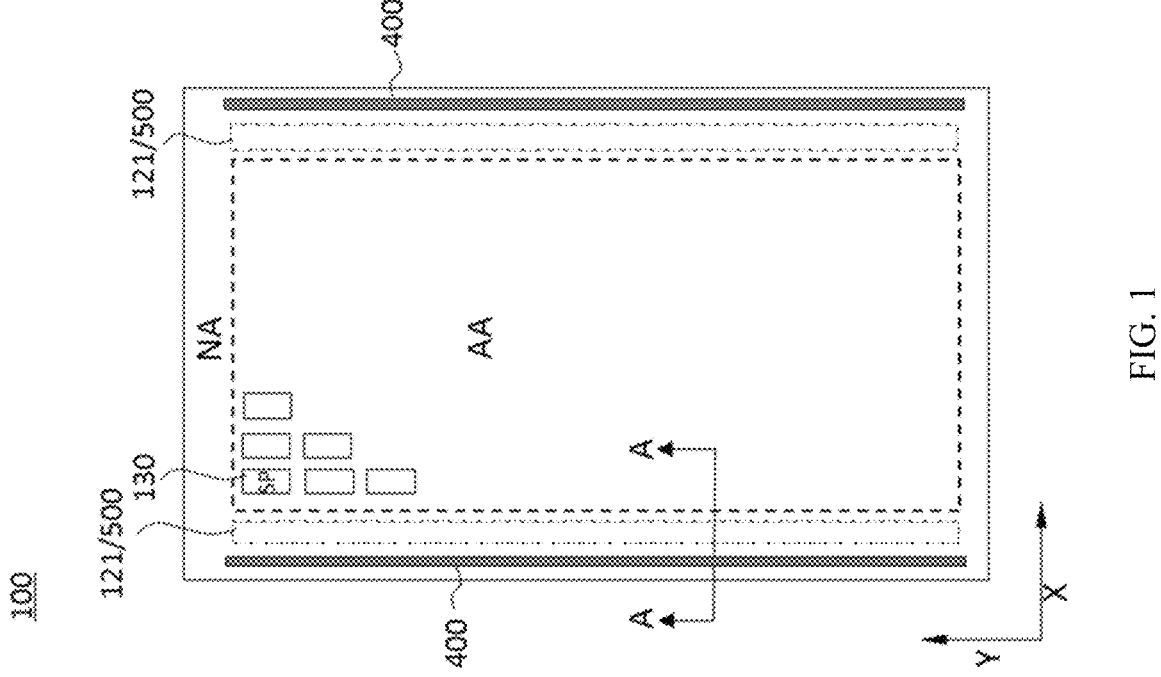
FIG. 1 illustrates a schematic of a display panel according to various embodiments of the present disclosure.

In order to make the above-mentioned objectives, features and advantages of the present disclosure more obvious and understandable, the present disclosure is further described below with reference to the accompanying drawings and embodiments.

It should be noted that specific details are set forth in the following description in order to fully understand the present disclosure. However, the present disclosure can be implemented in various other ways different from those described herein, and those skilled in the art can make similar generalizations without departing from the connotation of the present disclosure. Therefore, the present disclosure is not limited by the specific embodiments disclosed below.

The terms used in various embodiments of the present disclosure are only for the purpose of describing specific embodiments, and are not intended to limit the present disclosure. The singular forms of "a", "said" and "the" used in various embodiments of the present disclosure and the appended claims are also intended to include plural forms, unless the context clearly indicates other meanings.

It should be noted that the "upper", "lower", "left", "right" and other directional words described in various embodiments of the present disclosure are described from the angles shown in the accompanying drawings, and should not be understood as a limitation to various embodiments of the present disclosure. In addition, in the context, it should also be understood that when it is mentioned that an element is formed "on" or "under" another element, it can not only be directly formed "on" or "under" the other element, but also be formed "on" or "under" another element indirectly through an intermediate element.

Moreover, exemplary embodiments can be implemented in various forms, and should not be construed as being limited to embodiments set forth herein; on the contrary, the provision of such embodiments makes the present disclosure more comprehensive and complete, and fully conveys the concept of exemplary embodiments to those skilled in the art. Same reference numerals in the drawings represent same or similar structures, and thus their repeated description may be omitted. The terms expressing position and direction described in the present disclosure are all illustrated by taking the drawings as examples, but can also be changed according to needs; and such changes are all included in the protection scope of the present disclosure. The drawings of the present disclosure are only used to illustrate the relative position relationship. The layer thicknesses of some parts may be drawn in an exaggerated way to facilitate understanding. The layer thicknesses in the drawings may not represent the proportional relationship of the actual layer thicknesses. In addition, in the case of no conflict, various embodiments of the present disclosure and the features in various embodiments can be combined with each other. The drawings of various embodiments in the present application may use same reference numerals. Furthermore, the similarities between various embodiments may not be repeated.

Figure 2:
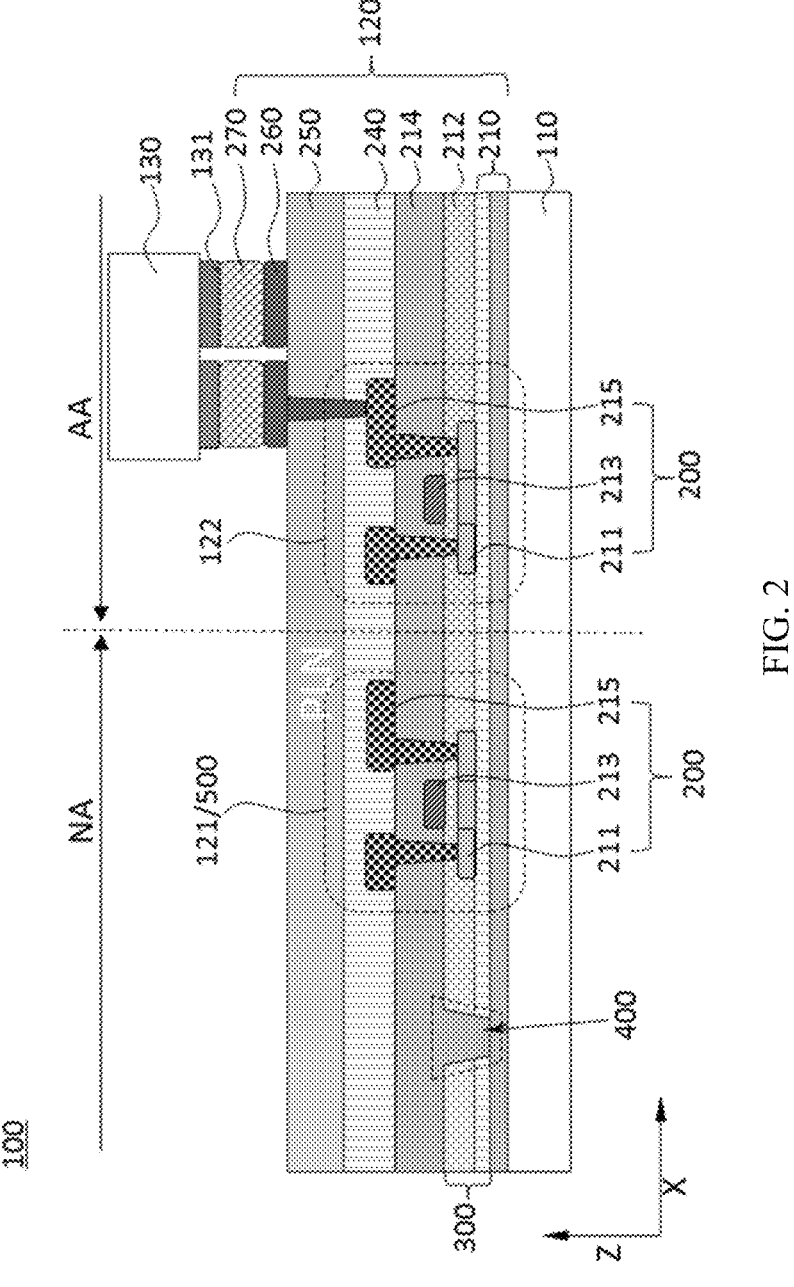
FIG. 2 illustrates a cross-sectional schematic along a cross-sectional line A-A in FIG. 1.

FIG. 1 illustrates a schematic of a display panel according to various embodiments of the present disclosure; FIG. 2 illustrates a cross-sectional schematic along a cross-sectional line A-A in FIG. 1; and the cross-section may be perpendicular to the plane where the display panel is located.

Optionally, a display panel 100 may be an LED display panel.

Optionally, the display panel 100 may be divided into a display region AA and a non-display region NA surrounding the display region AA. It can be understood that the dotted line in FIG. 1 may indicate the boundary between the display region AA and the non-display region NA.

Optionally, the display panel 100 may include a substrate 110, an array layer 120, and a light-emitting device 130 which are arranged sequentially. For example, the substrate 110 may be made of a poly material including glass, polyimide (PI), polycarbonate (PC), polyethersulfone (PES), polyethylene terephthalate (PET), polyethylene naphthalate (PEN), polyarylate (PAR), glass fiber reinforced plastic (FRP) and/or any other suitable material(s). The substrate 110 may be transparent, translucent or opaque; and the substrate 110 may be flexible or rigid.

Optionally, the display panel 100 may further include the array layer 120 on the side of the substrate 110.

Optionally, the array layer 120 may include a pixel circuit and a driving module for controlling the light-emitting device.

For example, the array layer 120 may include a plurality of pixel circuits 122 located in the display region AA and a driving module 121 located in the non-display region NA.

Optionally, the driving module 121 may be a scan driving circuit, that is, a VSR. It can be understood that the area circled by the dot dashed line in FIG. 1 is the area where the driving module 121 is disposed. Optionally, the display panel 100 in one embodiment may be driven on two sides, that is, the frame regions (located in the non-display region NA) on the two opposite sides of the display panel 100 along the first direction X may be respectively disposed with VSR circuits. Optionally, the arrangement direction of the driving circuits of each level in the VSR may be the extension direction of the frame, that is, the second direction Y.

Optionally, the driving module 121 may include a driving device 500. Optionally, the driving device 500 may be a thin film transistor (TFT) 200 in the driving module 121 (that is, a VSR circuit).

Optionally, the thin film transistor 200 may include a gate electrode 213, an active layer 211, and a source/drain electrode layer 215. Optionally, the array layer 120 wrapped in the display region AA may include the pixel circuits 122 which are in a one-to-one correspondence with the pixels, and the pixel circuits 122 may be designed to be arranged in an array corresponding to the pixels. The pixel circuit 122 may also include the thin film transistor 200. The film layer stacking relationship in the array layer 120 may be described in detail hereinafter.

For example, the array layer 120 may include a plurality of thin film transistors 200 and the pixel circuits and driving modules which are formed by the thin film transistors 200 for controlling the light emitting devices. A top-gate thin film transistor may be taken as an example for structural description in various embodiments of the present disclosure.

The array layer 120 may include the active layer 211 located on the substrate 110. The active layer 211 may be made of an amorphous silicon material, a polysilicon material, a metal oxide material or the like. The active layer 211 may further include a source region and a drain region formed by doping N-type impurity ions or P-type impurity ions, and a channel region between the source region and the drain region.

The array layer 120 may further include a gate electrode insulating layer 212 on the active layer 211. The gate electrode insulating layer 212 may include an inorganic layer such as silicon oxide and silicon nitride, and may include a single layer or multiple layers.

The array layer 120 may further include the gate electrode 213 located on the gate electrode insulating layer 212. The gate electrode 213 may be made of a material including a single layer or multiple layers of gold (Au), silver (Ag), copper (Cu), nickel (Ni), platinum (Pt), palladium (Pd), aluminum (Al), molybdenum (MO), or chromium (Cr); or alloys such as aluminum (Al) neodymium (Nd) alloy and molybdenum (MO) tungsten (W) alloy; or any other suitable material(s).

The array layer 120 may further include an interlayer insulating layer 214 located on the gate electrode 213. The interlayer insulating layer 214 may be formed by an inorganic insulating layer such as silicon oxide, silicon nitride and/or the like.

The array layer 120 may further include the source/drain electrode layer 215 located on the interlayer insulating layer 214. The source/drain electrode layer 215 may include a source electrode and a drain electrode. The source electrode and the drain electrode may be electrically connected (or coupled) to the source region and the drain region through contact vias, respectively. The contacts via may be formed by selectively removing the gate electrode insulating layer 212 and the interlayer insulating layer 214.

It should be understood that a certain film layer mentioned in various embodiments of the present application is "on" a certain reference film layer, which can be understood as being on the reference film layer "on the side away from the substrate". In addition, in the absence of special instructions, "upper" may only indicate the orientation relationship, and may not indicate that the two film layers must be adjacent or in contact with each other.

Optionally, the array layer 120 may further include a buffer layer 210, and the buffer layer 210 may be located on a side surface of the array layer 120 in contact with the substrate 110. Optionally, the buffer layer 210 may include a stacked structure including multiple inorganic and organic layers to block oxygen and moisture, prevent moisture or impurities from diffusing through the substrate, and provide a flat surface on the upper surface of the substrate 110, where the structure of the buffer layer may not be described in detail according to various embodiments of the present disclosure.

Optionally, the array layer 120 may further include a passivation layer 240. For example, the passivation layer 240 may be located on the thin film transistor 200 and cover the source/drain electrode layer 215. The passivation layer 240 may be formed of an inorganic layer such as silicon oxide or silicon nitride or formed of an organic layer.

Optionally, the array layer 120 may further include a planarization layer 250 on the passivation layer 240. The planarization layer 250 may include an organic layer such as acrylic, polyimide (PI), benzocyclobutene (BCB) and/or the like; and the planarization layer 250 may have a planarization effect.

Optionally, the display panel 100 may further include the light emitting device 130 located on the side of the array layer 120 away from the substrate 110. For example, the light-emitting device 130 may be an LED, that is, a light-emitting diode. A plurality of light-emitting devices 130 may be arranged in an array on the array layer 120 and electrically connected to the pixel circuits 122 arranged in an array in the array layer 120 in a one-to-one correspondence.

LEDs of any size, such as nano-LEDs, micro-LEDs, mini-LEDs and the like, may be used in the present application. For the convenience of illustration, the micro-LED as the light-emitting device may be taken as an example for description hereinafter.

Optionally, the light-emitting device 130 may be a micro light-emitting diode (micro-LED). For example, the light-emitting device 130 may include a first semiconductor layer, a quantum well layer and a second semiconductor layer which are stacked with each other. The quantum well layer may be located between the first semiconductor layer and the second semiconductor layer. The light-emitting device 130 may further include an electrode layer 131. Optionally, the electrode layer 131 in one embodiment may be located on the side of the light-emitting device 130 adjacent to the pixel circuit. The electrode layer 131 may include at least two electrodes; and the two electrodes may be connected to the first semiconductor layer and the second semiconductor layer, respectively.

Optionally, the electrode layer 131 of the light-emitting device may include a first electrode and a second electrode. The first electrode and the second electrode may be the anode and the cathode of the light-emitting device (e.g., N-pole and P-pole, and also called cathode and anode). The first semiconductor layer may be located on the side of the second semiconductor layer adjacent to the pixel circuit; the first electrode may be located on the side of the first semiconductor layer adjacent to the pixel circuit, and the second electrode may be located on the side of the second semiconductor layer adjacent to the pixel circuit.

Obviously, in other embodiments of the present application, one of the first electrode and the second electrode of the light-emitting device may be arranged toward the pixel circuit, and the other one may be arranged away from the pixel circuit, or both the first electrode and the second electrode of the light-emitting device may be arranged away from the pixel circuit according to needs, which may not be described in detail herein.

Optionally, the array layer 120 may further include a connection electrode 260 on the planarization layer 250, and the connection electrode 260 may be made of a conductive material. The connection electrode 260 may include a first connection electrode and a second connection electrode respectively corresponding to two electrodes in the electrode layer 131 of the light-emitting device 130.

Optionally, the array layer 120 may further include a eutectic layer 270 on the connection electrode 260. The connection electrode 260 may be connected to the electrode layer 131 of the light-emitting device 130 through the eutectic layer 270. In addition, the connection electrode 260 may be electrically connected to the pixel circuit 122 or other circuit devices in the array layer 120, thereby electrically connecting the light-emitting device 130 to the pixel circuit 122 or other circuit devices to control the light-emitting device 130.

Optionally, in some optional embodiments of the present application, as shown in FIGS. 14-17, FIGS. 14-17 illustrate cross-sectional schematics according to various embodiments of the present disclosure. The display panel 100 may further include a cover plate disposed opposite to the array layer 120. Optionally, the cover plate may be made of a glass material. The cover plate may be attached to the array layer 120 by an adhesive material, such that the light-emitting device 130 may be protected between the cover plate and the array layer 120. Optionally, the adhesive material may be an transparent optical adhesive OCA.

Referring to FIG. 1 and FIG. 2, optionally, an insulating layer 300 in the array layer 120 may have a groove 400, which is the area shown by the inverted trapezoidal dashed-line frame in FIG. 1.

Optionally, the groove 400 may be located in the non-display region NA.

For example, in one embodiment, the array layer 120 may include the buffer layer 210, the gate electrode insulating layer 212, the interlayer insulating layer 214, the passivation layer 240 and the planarization layer 250, which extend from the display region AA to the non-display region NA and finally to the edge of the display panel 100. The insulating layer 300 in the array layer 120 may include one or a combination of one or more of the buffer layer 210, the gate electrode insulating layer 212, the interlayer insulating layer 214, the passivation layer 240, and the planarization layer 250.

It should be noted that a sub-layer in the buffer layer 210 closest to the active layer 211 and the gate electrode insulating layer 212 may be stacked in a surface contact manner in the non-display region NA, and these two layers may be regarded as a combined layer. Therefore, in one embodiment, the composite film layer formed by the combination of a sub-layer in the buffer layer 210 and the gate electrode insulating layer 212 may be used as the insulating layer 300 for description below. Obviously, a sub-layer of the buffer layer 210 close to the active layer 211 and the gate electrode insulating layer 212 may be regarded as two insulating layers, respectively. Therefore, the sub-layer of the buffer layer 210 close to the active layer 211 may be an example of the insulating layer, and the gate electrode insulating layer 212 may be another example of the insulating layer; and such understanding may not be contrary to the concept of the present disclosure.

Optionally, the groove 400 may be located between the edge of the display panel 100 and the driving device 500.

For example, the driving device 500 may be located in the non-display region NA between the display region AA and the edge of the display panel 100. The groove 400 may be located on the side of the driving device 500 away from the display region AA, and the groove 400 may be also located in the non-display region NA. Compared with the driving device 500, the groove 400 may be closer to the edge of the display panel 100. In other words, the edge of the display panel 100 and the driving device 500 may be blocked by the groove 400.

Optionally, the groove 400 may pass through the insulating layer 300, and the film layers (also the dielectric layers made of an insulating material) on the upper and lower adjacent sides of the insulating layer 300 may be in contact with each other through the groove 400. In such way, a pinning structure may be formed to improve the structural stability of the edge region of the display panel.

Optionally, the driving device 500 may be an LED device, and the minimum distance from an edge of the driving device 500 to the edge of the display panel 100 may range from 150 μm to 300 μm.

Optionally, the minimum distance between the edge of the driving device 500 and the edge of the display panel 100 may range from 100 μm to 500 μm, such that certain compensation space may be reserved for process errors.

Optionally, the minimum distance between the edge of the driving device 500 and the edge of the display panel 100 may range from 100 μm to 200 μm, such that the frame of the display panel may be further reduced while ensuring structural reliability.

Optionally, the minimum distance between the edge of the driving device 500 and the edge of the display panel 100 may be the minimum distance between the edge of the driving device 500 and the edge of the display panel 100 along the first direction X.

Compared with OLED devices, LED devices have excellent environmental stability, and LED display panels may not need packaging technologies used in the OLED devices such as TFE packaging or Frit packaging. Such feature may enable the micro LED to have a great advantage in the application of splicing screens.

The inventor found that similar array layer design used in the OLED devices may cause the problem of aggravated corrosion of VSR devices by water and oxygen after being applied to the LED display panel.

After further research, the inventor found that in order to ensure the effectiveness of the encapsulation layer (especially the thin-film encapsulation layer TFE), it is necessary to reserve a certain space for the encapsulation layer in the frame (the non-display region) of the display panel. In such way, the encapsulation layer may successfully encapsulate the light-emitting device.

For the LED display panel, the encapsulation layer TFE may not be needed. On the one hand, it will increase the cost; on the other hand, because for the LED display panel, the formation manners of light-emitting devices are different, the design of the encapsulation layer TFE may be no longer applicable, but may hinder the formation of the display panel. However, after the LED display panel without the encapsulation layer TFE is tested, it is found that there may be a problem that ambient water and oxygen may increase the impact on the VSR circuit, thereby worsening the substrate lifetime.

After further research, the inventor found that the frame becomes narrower after the encapsulation layer of the display panel is removed, and the VSR is closer to the edge of the substrate, which results in the influence of ambient water and oxygen on the VSR circuit. However, in the OLED display panel, a certain space must be reserved for the encapsulation layer in the frame (non-display region) of the display panel; and the minimum distance between the edge of the driving device in the OLED display panel and the edge of the display panel may be guaranteed to be at the range of 500 μm-600 μm. In such distance range, even without the protection of the encapsulation layer, the ambient water and oxygen may have relatively small impact on the VSR circuit.

In other words, on the one hand, users expect that the frame of the display panel that does not display the picture may be as narrow as possible, so that the encapsulation layer may be cancelled to reduce the frame space occupied by the encapsulation layer for effective encapsulation, and reduce the width of the display panel frame. On the other hand, as the frame becomes narrower, the distance between the edge of the display panel and the VSR may begin to decrease, and the $H_2O/O_2$ entering path may be significantly shortened; and the encapsulation layer TFE is cancelled; therefore, the VSR region may be more susceptible to corrosion, causing abnormal circuit operation.

The inventor designed the above-mentioned structure (embodiment) based on the contradictions and problems discovered by the inventor, and the edge of the display panel and the driving device may be blocked by the groove. While ensuring that the display panel achieves a narrow frame, the problem of $H_2O/O_2$ entering in the VSR region may be improved, such that the corrosion resistance of the panel may be improved to increase the service lifetime of the display panel.

In addition, the inventor also studied the safe minimum distance between the edge of the driving device and the edge of the display panel after being protected by the groove. That is, the safe minimum distance between the edge of the driving device 500 and the edge of the display panel 100 may range from 150 μm to 300 μm. Compared with the OLED display panel, the TFE may be omitted, the frame width may be reduced, and the safety of the driving device may also be ensured.

Optionally, for the LED display panel in various embodiments of the present application, the array substrate may be directly cut into a narrow frame or frameless display panel.

Optionally, the distance from the groove 400 to the edge of the display panel 100 may be greater than 100 μm.

The inventor found that due to the characteristics of the LED display panel of the present application, the groove itself may be relatively close to the edge of the array substrate. If it is extremely close to the display panel, the groove structure itself may be affected by the formation process, such as cutting, and the groove structure itself may be at risk. Therefore, considering the process deviation, controlling the distance from the groove to the edge of the display panel to the range greater than 100 μm may improve the yield of the groove.

Optionally, the distance between the groove 400 and the edge of the display panel 100 may be the distance between the groove 400 and the edge of the display panel 100 along the first direction X.

Optionally, the groove 400 may be at the same layer as the active layer 211 in the driving device 500, that is, the insulating layer covering the active layer may be disposed with the groove, or the insulating layer adjacent to the active layer may be disposed with the groove. Water and oxygen entering in the driving device 500 mainly affect the performance of the active layer. Therefore, particular film layers may be selected to be disposed with the groove to maximize the effectiveness of the groove structure and avoid wiring space wasting in the display panel.

Optionally, the light-emitting device 130 in the present application may be an LED, and the distance between the groove 400 and the device in a nearest array layer (for example, the driving device 500, the signal line and the like) may be less than 100 μm, which may further implement the narrow frame effect. The inventor found that even if the encapsulated OLED device is to be disposed with the groove, the groove may need to be located outside the region covered by the encapsulation layer to be effective. Even if the OLED device is to be disposed with the groove, the distance between the groove and the device in the array layer must be greater than 200 μm; in such way, the narrow frame effect may not be implemented.

Figure 3:
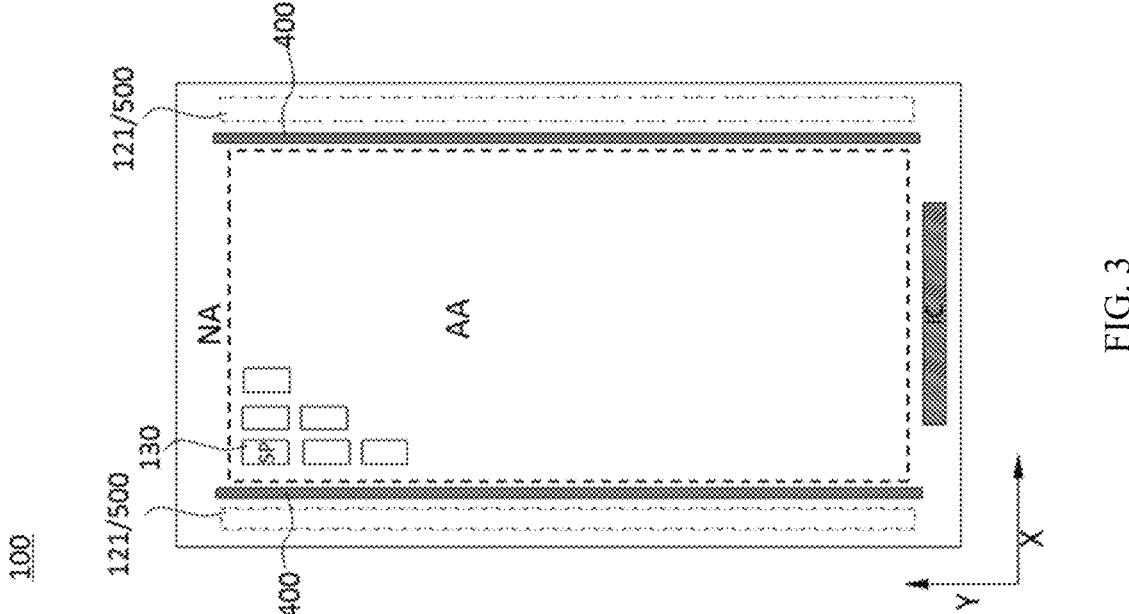
FIG. 3 illustrates a schematic of another display panel according to various embodiments of the present disclosure.

Obviously, in other optional embodiments of the present application, as shown in FIG. 3, FIG. 3 illustrates a schematic of another display panel according to various embodiments of the present disclosure. The similarities with the above-mentioned embodiments may not be repeated herein; and the difference may be that the groove 400 in one embodiment may be located between the light-emitting device 130 and the driving device 500. That is, the groove 400 may be spaced between the driving device 500 and the display region AA.

As the frame of the display panel is reduced, the VSR may be closer to the display region, such that the vias on the passivation layer and the planarization layer in the display region may have the risk of water and oxygen entering. Through the above-mentioned embodiments, positioning the groove between the light-emitting device and the display region may prevent the water and oxygen introduced by the vias in the display region from affecting the driving device.

Figure 4:
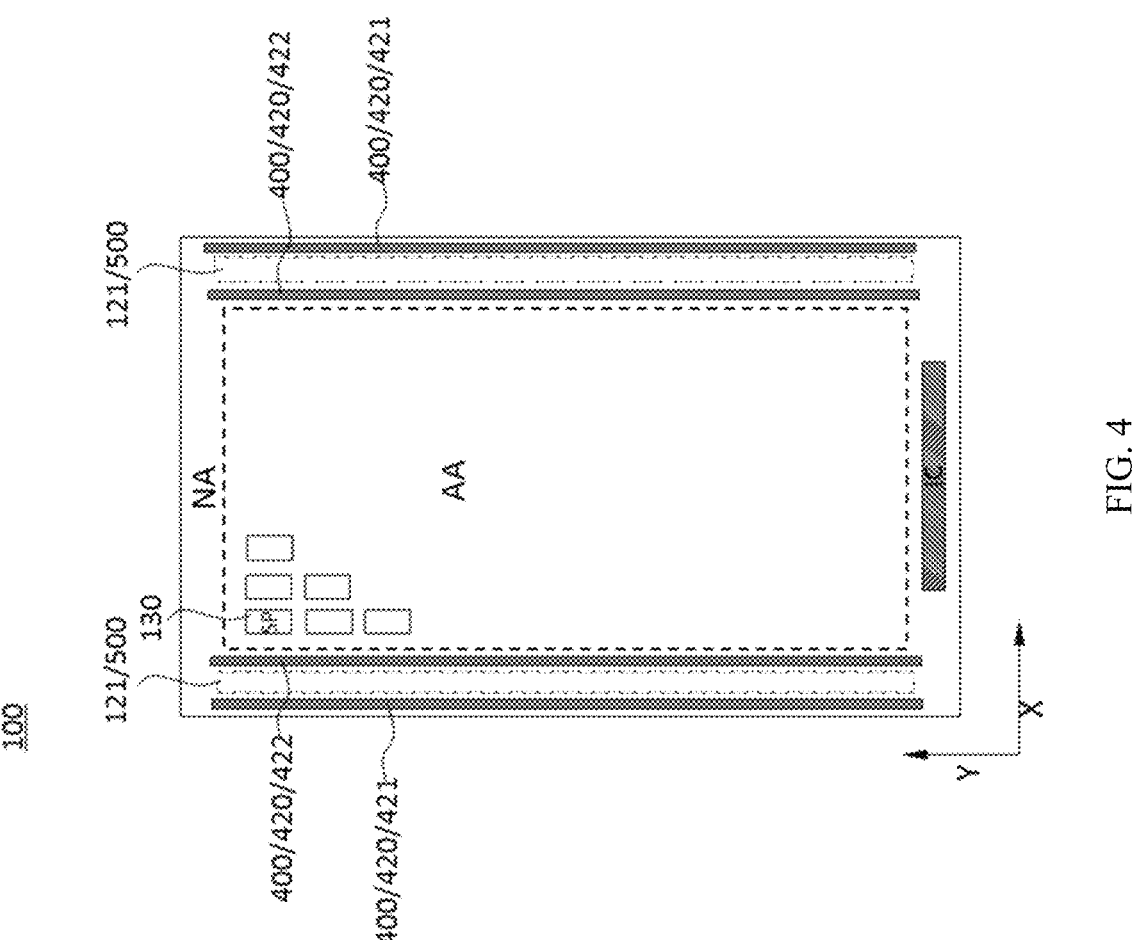
FIG. 4 illustrates a schematic of another display panel according to various embodiments of the present disclosure.

Obviously, in other optional embodiments of the present application, as shown in FIG. 4, FIG. 4 illustrates a schematic of another display panel according to various embodiments of the present disclosure. In one embodiment, it may have both of two types of the above-mentioned grooves, that is, the groove between the edge of the display panel and the driving device and the groove between the light-emitting device and the driving device. In such way, water and oxygen entering may be blocked in both directions, and the lifetime of the display panel may be further improved.

In addition, the design of the present application may also take into account the two problems of PVEE resistance reduction and avoiding the VSR water and oxygen entering, which may be described in the related parts below.

Figure 5:
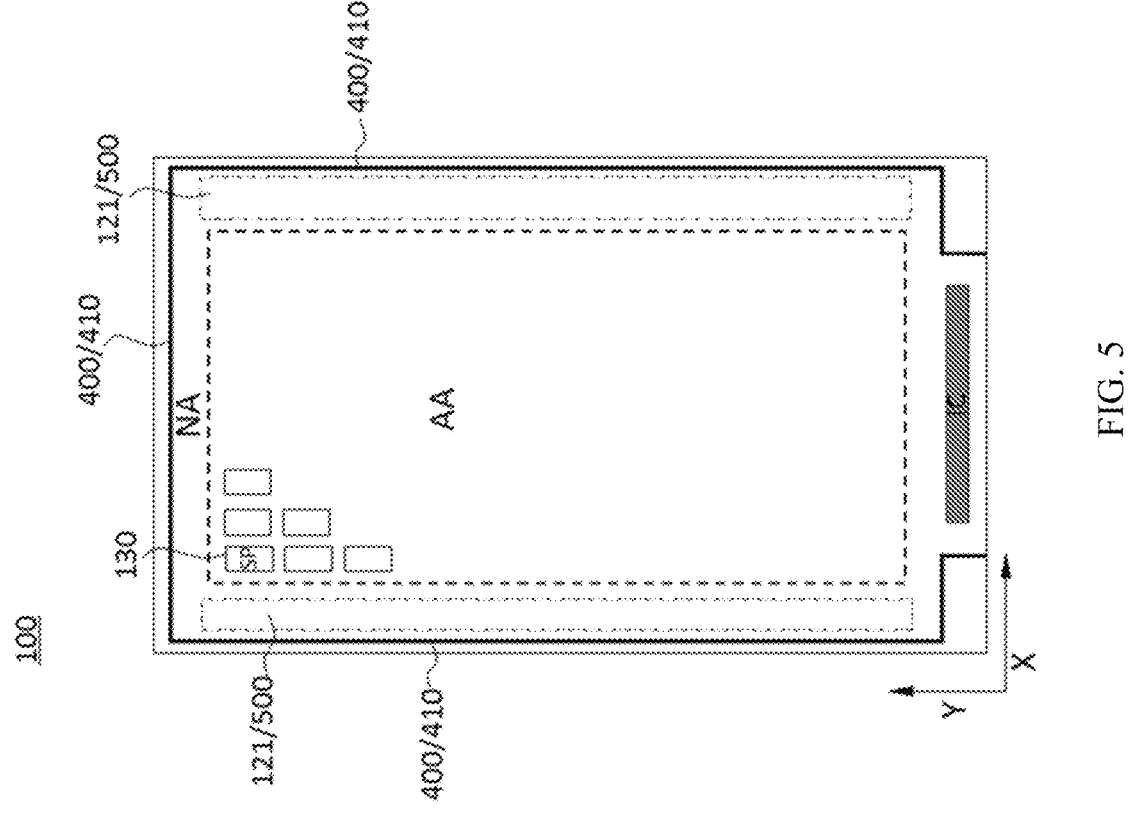
FIG. 5 illustrates a schematic of another display panel according to various embodiments of the present disclosure.

As shown in FIG. 5, FIG. 5 illustrates a schematic of another display panel according to various embodiments of the present disclosure.

The groove 400 may include a first groove 410; and the first groove 410 may be disposed corresponding to the edge of the display panel 100.

For example, the display panel 100 may include one or more first grooves 410. The first groove 410 may be located close to the edge of the display panel 100 in the non-display region NA, and may surround other devices at the display region AA of the display panel 100 or inside the display panel 100 along the edge of the display panel 100. It can be understood that the surrounding mentioned here may refer to the extension of the orthographic projection of the first groove 410 on the plane where the substrate 110 is located, or in other words, the extension of the first groove 410 on the plane where the display panel 100 is located. "The first groove 410 may be disposed corresponding to the edge of the display panel 100" may be understood as that the extending path of the first groove 410 on the above-mentioned plane and the extending path of the edge of the display panel 100 may be kept as consistent as possible. The outline enclosed by most of the first groove 410 and the outline enclosed by the edge of the display panel 100 may be similar to each other. Locally, the first groove 410 may be embodied as being in parallel with the adjacent edge of the display panel 100. Obviously, in some unavoidable regions that need to be avoided, the first groove 410 may slightly deviate from an extending path in parallel with the edge of the display panel 100 to avoid some unavoidable structures.

Optionally, the first groove 410 may surround the display region AA in a non-closed manner. For example, when the display panel 100 is rectangular, the extending path of the first groove 410 may form a structure similar to a symbol as ⊏, thereby surrounding at least three sides of the display region AA of the display panel 100. Obviously, in some other optional embodiments, the first groove may enclose the display region AA in a closed manner.

Optionally, the first groove 410 may be located between the edge of the display panel 100 and the driving device 500. In other words, the first groove 410 may not only surround the display region AA, but also surround the driving device 500 together with the display region AA.

It should be noted that in one embodiment, whether there are one or more grooves 400, at least one groove that satisfies certain characteristics is called the first groove 410; for the plurality of grooves 400 including a plurality of grooves satisfying the above-mentioned characteristics, it can be understood as that the display panel 100 may include a plurality of first grooves 410.

Optionally, the plurality of first grooves may be included in the present disclosure, and may be disposed by stacking over each other along the direction pointing from the edge of the display panel to the display region. If they are surrounding first grooves, the plurality of first grooves may be disposed in a nested manner.

Through the above-mentioned embodiments, the design of the surrounding first groove may further improve the corrosion resistance of the display panel and increase the service lifetime. The first groove may act like the first defense line of the display panel, basically may not affect the layout of other devices inside the display panel, and may comprehensively and multi-directionally protect the outside water and oxygen from entering the edges in all directions.

Figure 6:
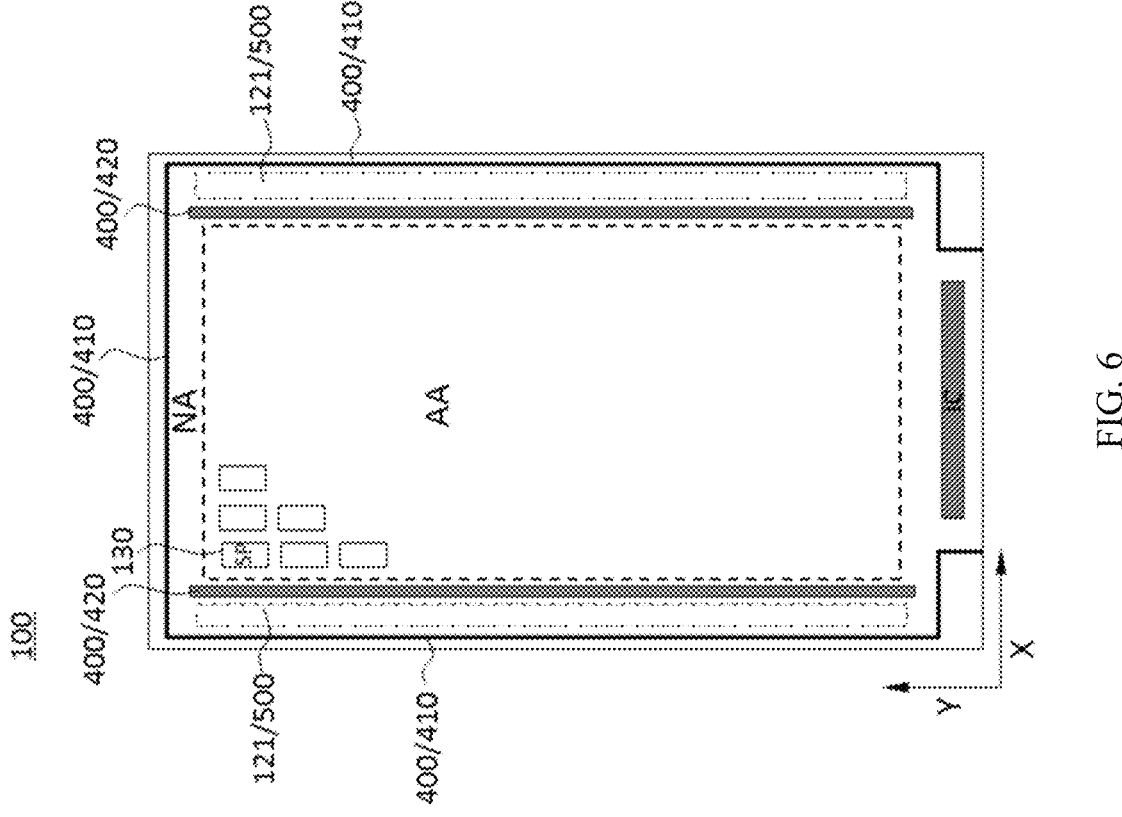
FIG. 6 illustrates a schematic of another display panel according to various embodiments of the present disclosure.

Obviously, in other optional embodiments of the present application, as shown in FIG. 6, FIG. 6 illustrates a schematic of another display panel according to various embodiments of the present disclosure. The groove between the edge of the display panel and the driving device and the groove between the light-emitting device and the driving device may both be included; and the groove located between the edge of the display panel and the driving device may be the first groove. In such way, both sides of the VSR may be protected to avoid the influence of water and oxygen entering on the VSR from the end face of the frame and the vias in the AA region. Meanwhile, two sides of the VSR are respectively designed with grooves with different forms and shapes, for example, a surrounding first groove may be disposed at the side of the VSR toward the frame, and a long-striped groove extending along the display region may be disposed at the side of the VSR toward the display region. Therefore, it may be matched with the layout of the display panel and also more effectively facilitate water and oxygen blocking, such that the utility of the grooves may be higher.

In some optional embodiments of the present application, referring to the embodiments shown in any one of the drawings in FIG. 4, FIG. 6, FIG. 7 or FIG. 18, the groove 400 may include a second groove 420; and the second groove 420 may be disposed corresponding to the driving device 500.

Optionally, the driving module 121 may be a scan driving circuit, that is, a VSR. The driving module 121 may include multiple-level driving circuits, which are arranged step by step along the edge of the display region AA. The driving device 500 may be the thin film transistor 200 in the driving circuit.

Optionally, the display panel 100 may include a plurality of driving devices, and the second grooves 420 may be disposed corresponding to the driving devices 500, that is, the second grooves 420 may be disposed corresponding to the arrangement of the plurality of driving devices. For example, the driving device 500 may include the multiple-level driving circuits, and the multiple-level driving circuits may be arranged along the edge of the display region AA; therefore, the overall arrangement region of the plurality of driving devices 500 may also coincide with the arrangement path of the driving circuits, that is, also a striped-like region formed along the edge region of the display region AA, for example, the long-striped region circled by the dot dashed line in FIG. 4, FIG. 6, FIG. 7 or FIG. 18. The second groove 420 may extend along the extending direction of the edge of the display region AA to form the striped groove.

For example, along the first direction X, the driving modules 121 may be respectively disposed on two opposite sides of the display panel 100, and the driving circuits at various levels in the driving module 121 may be arranged along the second direction Y. Therefore, the second groove 420 may be a long-striped groove extending along the second direction Y.

It should be noted that in other optional embodiments of the present application, the first groove and the second groove may have break points in their extending paths. That is, the first groove or the second groove may be a plurality of sub-portions, the sub-portions may extend along the above-designed path and may be sequentially arranged along the above-designed path, and spacings may be between the sub-portions.

Obviously, in some other optional embodiments of the present application, the second grooves may be disposed corresponding to the driving devices, that is, the second grooves may be disposed in a manner corresponding to the contours of the plurality of driving devices. In other words, the second grooves may extend along the edges of the driving devices. Optionally, the driving device may be a thin film transistor, the second groove may be disposed as a closed surrounding, or the second groove may be disposed as a non-closed surrounding, or the plurality of second grooves may be disposed by sandwiching the thin film transistor or the active layer of the thin film transistor. In such way, while having the technical effects of the above-mentioned embodiments, the driving device may be protected more specifically, the range of the protection region formed by the second groove may be reduced, and the protection efficiency may be improved. Furthermore, it is also beneficial for the arrangement and passage of other devices, and other devices or wires may pass through the gaps between the protection regions enclosed or clamped by the second grooves corresponding to different thin film transistors without crossing lines or changing layers.

For example, a first power signal line PVEE described below may extend to the non-display region and pass through the gap between the grooves which isolate different driving devices, and then may be connected to a first light-blocking part 810 (i.e., an auxiliary conductive portion 800) through a via.

It should be noted that the "second" mentioned in the second groove herein is only for the convenience of understanding to distinguish the grooves in other embodiments. It does not indicate that in one embodiment, there must be a "first groove" before there is a "second groove". In some embodiments of the present application, as shown in FIG. 6, the display panel 100 may have both the first groove 410 and the second groove 420. Optionally, the first groove 410 may surround the display region AA, the driving device 500 and the second groove 420. As shown in FIG. 5, the display panel 100 may only have the first groove 410. Also, as shown in FIG. 1, FIG. 3 or FIG. 4, the display panel 100 may only have the second groove 420. It can be understood that the groove 400 in FIG. 1 and FIG. 3 may be regarded as the second groove in some cases according to the topography.

Optionally, the display panel 100 may include a combination of any number (including the case where the number is zero) of the first grooves and any number (including the case where the number is zero) of the second grooves. For example, as shown in FIGS. 1 and 3, there is only one second groove beside the driving device in the non-display region NA on the side of the display region AA of the display panel 100. It should be noted that "number" mentioned in this paragraph can be understood as "layer", which counts the number of grooves from the angle of the second direction Y. That is, the path, which is from the edge of the display panel 100 through the driving device 500 in the non-display region NA to the display region AA adjacent to the edge, may need to pass through several "number" or "layers" of grooves.

Figure 7:
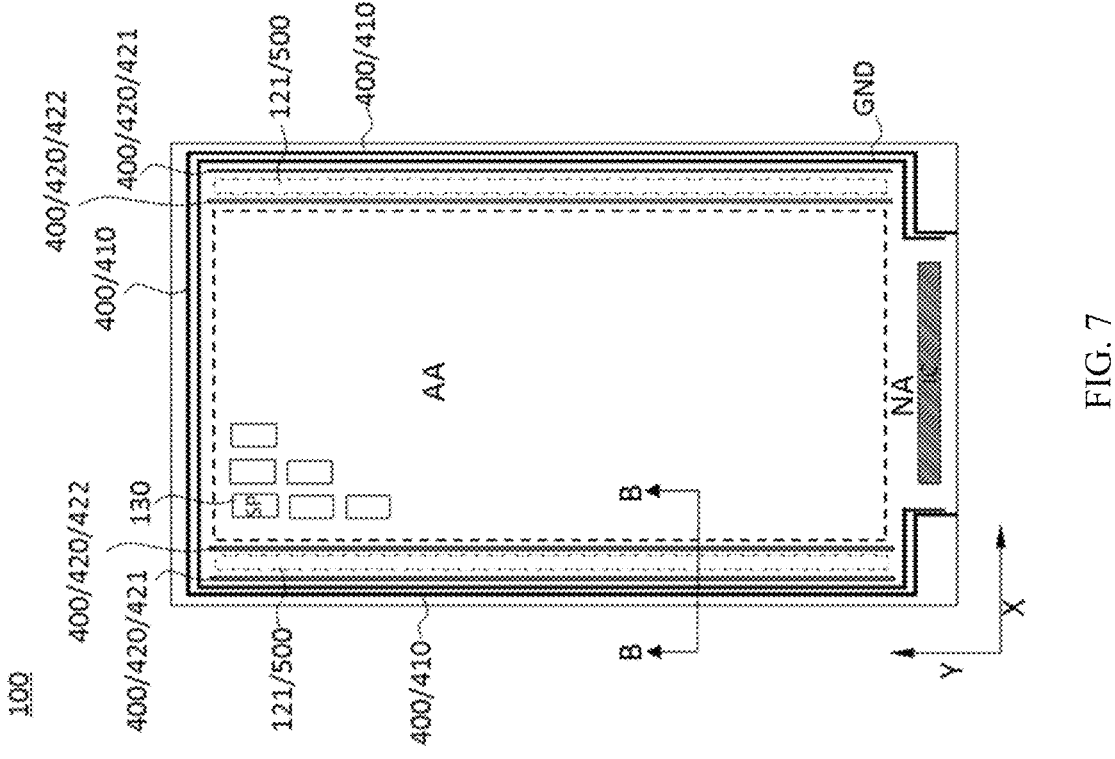
FIG. 7 illustrates a schematic of another display panel according to various embodiments of the present disclosure.

Obviously, in some optional embodiments of the present application, as shown in FIG. 4 or FIG. 7, FIG. 7 illustrates a schematic of another display panel according to various embodiments of the present disclosure. At least two second grooves 420 may be beside the driving device 500 in the non-display region NA on the side of the display region AA of the display panel 100, and the two second grooves 420 may be located on both sides of the driving device 500, respectively.

For example, along the first direction X, the second groove 420 may include a first sub-groove 421 and a second sub-groove 422 which are located on both sides of the driving device 500. The first sub-groove 421 may be located between the edge of the display panel 100 and the driving device 500, and the second sub-groove 422 may be located between the light-emitting device 130 and the driving device 500.

It can be understood that, in one embodiment, the first direction X is the direction pointing from the edge of the display panel 100 to the display device, it can also be understood the first direction X is the direction perpendicular to the arrangement direction of the driving circuits at various levels of the driving module 121, or the direction perpendicular to the edge of the display panel 100 at such position.

Optionally, the first sub-groove 421 and the second sub-groove 422 may be respectively striped grooves extending along the second direction Y.

Through the above-mentioned embodiments, the first sub-groove 421 and the second sub-groove 422 may be like two parallel lines, with the driving module 121 or the driving device 500 sandwiched between the first sub-groove 421 and the second sub-groove 422; and may protect both sides of the VSR and avoid the impact of water and oxygen entering on the VSR from the frame end face of the display panel and PV/PLN vias.

Figure 8:
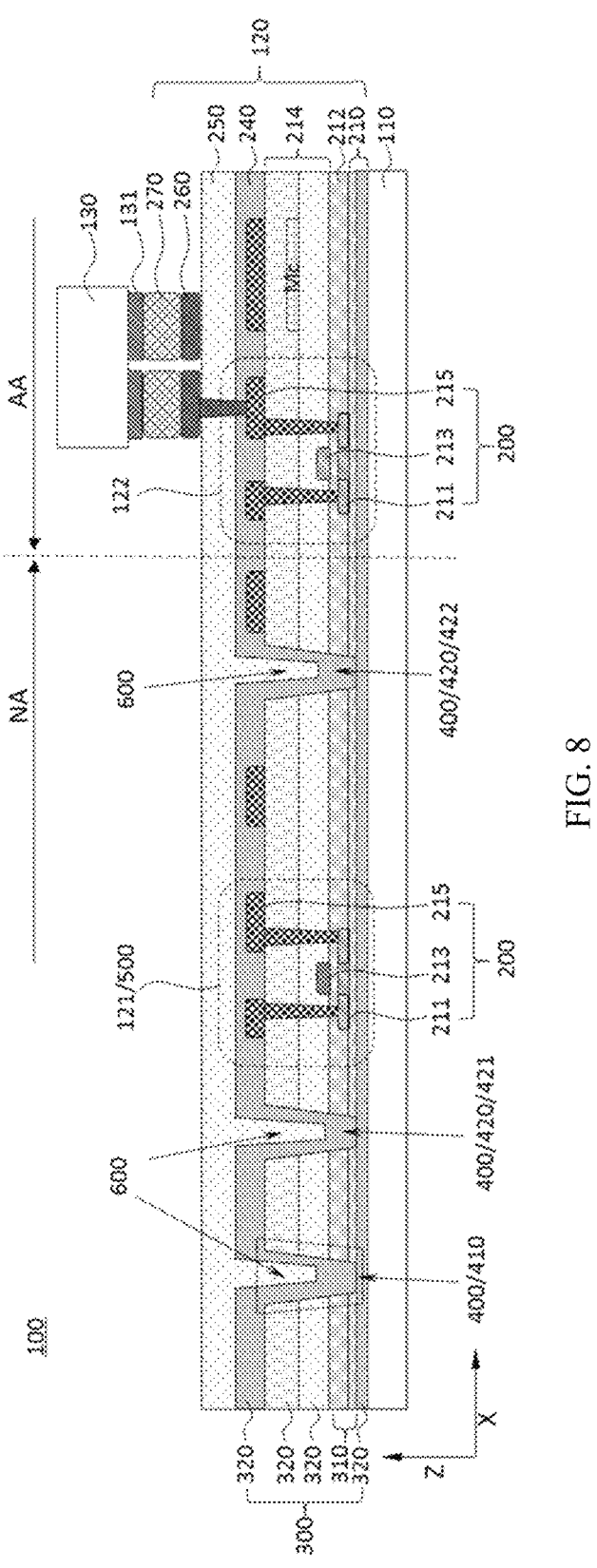
FIG. 8 illustrates a cross-sectional schematic along a cross-sectional line B-B in FIG. 7.

As shown in FIGS. 7-8, FIG. 8 illustrates a cross-sectional schematic along a cross-sectional line B-B in FIG. 7. The cross-section may be perpendicular to the plane where the display panel is located. The similarities between one embodiment and the above-mentioned embodiments may not be described in detail.

Optionally, the display panel 100 may have all of the first groove 410, the first sub-groove 421, and the second sub-groove 422.

Optionally, the first groove 410 may surround the display region AA, the driving device 500, the first sub-groove 421 and the second sub-groove 422.

Through the above-mentioned embodiments, on the one hand, the surrounding first groove may serve as a guarantee for the first layer of protection by blocking water and oxygen; on the other hand, the first sub-groove and the second sub-groove in parallel with each other, holding (e.g., containing) the VSR, may serve as a guarantee for the second layer of protection by blocking water and oxygen. Two types of grooves may use their respective location advantages and morphological advantages to protect the VSR more specifically, and may have complementary effects to avoid the influence of water and oxygen entering on the end surface of the frame and the vias in the AA region.

As shown in FIGS. 9-17, FIGS. 9-17 illustrate cross-sectional schematics of display panels along a first direction according to various embodiments of the present disclosure. The cross-section may be perpendicular to the plane where the display panel is located.

Referring to the cross-sectional view of any embodiment of the present application, the insulating layer 300 may include a plurality of sub-layers stacked along a third direction Z. The third direction Z may be the direction perpendicular to the plane where the display panel 100 is located.

Optionally, the insulating layer 300 may be a collective term for a composite film layer formed by stacking various insulating materials of the array layer 120 in the non-display region NA.

Optionally, the insulating layer 300 may include one or a combination of the buffer layer 210, the gate electrode insulating layer 212, the interlayer insulating layer 214, the passivation layer 240, and the planarization layer 250.

Optionally, the insulating layer 300 may include at least one first insulating layer 310 and at least one second insulating layer 320. That is, one or more sub-layers in the insulating layer 300 may be classified as the first insulating layers 310, and these sub-layers may meet the design requirements of the first insulating layer 310 in the present application; and the design of the second insulating layer may be similar to that of the first insulating layer, which may not be described in detail.

Optionally, the groove 400 may be disposed at least in the first insulating layer 310. That is, the groove 400 described in the above-mentioned embodiments may be disposed only in a part of the sub-layers of the insulating layer 300, where the first insulating layer 310 must be disposed with the groove 400.

Optionally, the groove 400 may pass through the sub-layers of the insulating layer 300 where the groove 400 is disposed. That is, the first insulating layer 310 may be passed through by the groove 400, the groove 400 may expose the film layer under the first insulating layer 310, and the film layer over the first insulating layer 310 may be in contact with the film layer under the first insulating layer 310 through the groove 400. The sidewall of the groove 400 may be formed by the film layers disposed with the groove 400, and the bottom of the groove 400 may be formed by adjacent film layers under the film layer disposed with the groove 400. For example, the bottom of the groove 400 formed in the first insulating layer 310 may be formed by an adjacent second insulating layer 320 under the first insulating layer 310.

Optionally, the groove 400 disposed in the first insulating layer 310 may be one or a combination of the first groove 410, the first sub-groove 421, and the second sub-groove 422.

Optionally, adjacent sub-layers of the insulating layer 300 disposed with the groove 400 may be passed through by a same groove 400. That is, the first insulating layer 310 may be a composite film layer composed of a plurality of adjacent sub-layers, which are passed through by a same groove 400, and at least one groove 400 may be formed in the composite film layer formed by the plurality of first insulating layers 310.

Optionally, the sub-layers of the insulating layer 300 may all be inorganic material layers. That is, the first insulating layer 310 and the second insulating layer 320 may both be inorganic insulating layers.

Optionally, the first insulating layer 310 may be an oxide insulating layer; and the second insulating layer 320 may be a nitride insulating layer.

Optionally, the first insulating layer may be made of silicon oxide; and the second insulating layer may be made of silicon nitride.

The inventor further found that the film quality of SiNx may be relatively dense and the water and oxygen blocking ability may be strong; and the film quality of $SiO_2$ may be relatively loose, and the water and oxygen blocking ability may be relatively weak. That is, not all of the film layers in the insulating layer may be film layers which provide water and oxygen entering paths, and certain film layers may play a protective role to block water and oxygen entering. Through the above-mentioned embodiments, it is avoided that the insulating layer may be hollowed out blindly, and the structural stability of the insulating layer may be prevented from being affected; the sub-film layers in the insulating layer may be matched with each other; while ensuring the stability of the film layer structure, it may further improve the water and oxygen blocking ability which makes the groove structure more effective.

Optionally, at least one second insulating layer 320 may fill the groove 400.

For example, at least one sub-layer of the insulating layer disposed with the groove 400 may be disposed adjacent to the second insulating layer 320, and the second insulating layer 320 may be in contact with the sidewall and bottom of the groove 400.

Optionally, the second insulating layer 320 may completely cover the sidewall and bottom of the groove 400. That is, although the sidewall and bottom of the groove are formed by different film layers, the jointing position of the sidewall and the bottom may also be covered by the second insulating layer.

SiNx has stronger water and oxygen blocking properties than $SiO_2$ and organic film layers. Therefore, through the above-mentioned embodiments, it is ensured that all film layers along the vertical direction in the groove region may be the SiNx film layers to better block the water vapor entering from the side, and further improve the ability of anti-environmental stability.

Optionally, in some embodiments of the present application, the groove may directly pass through all insulating layers in the array layer under the second insulating layer to directly expose the substrate. The second insulating layer may be in contact with the substrate through the groove, such that all film layers under the second insulating layer may be sealed by the second insulating layer and the substrate. Optionally, the substrate may be a glass material.

Figure 9:
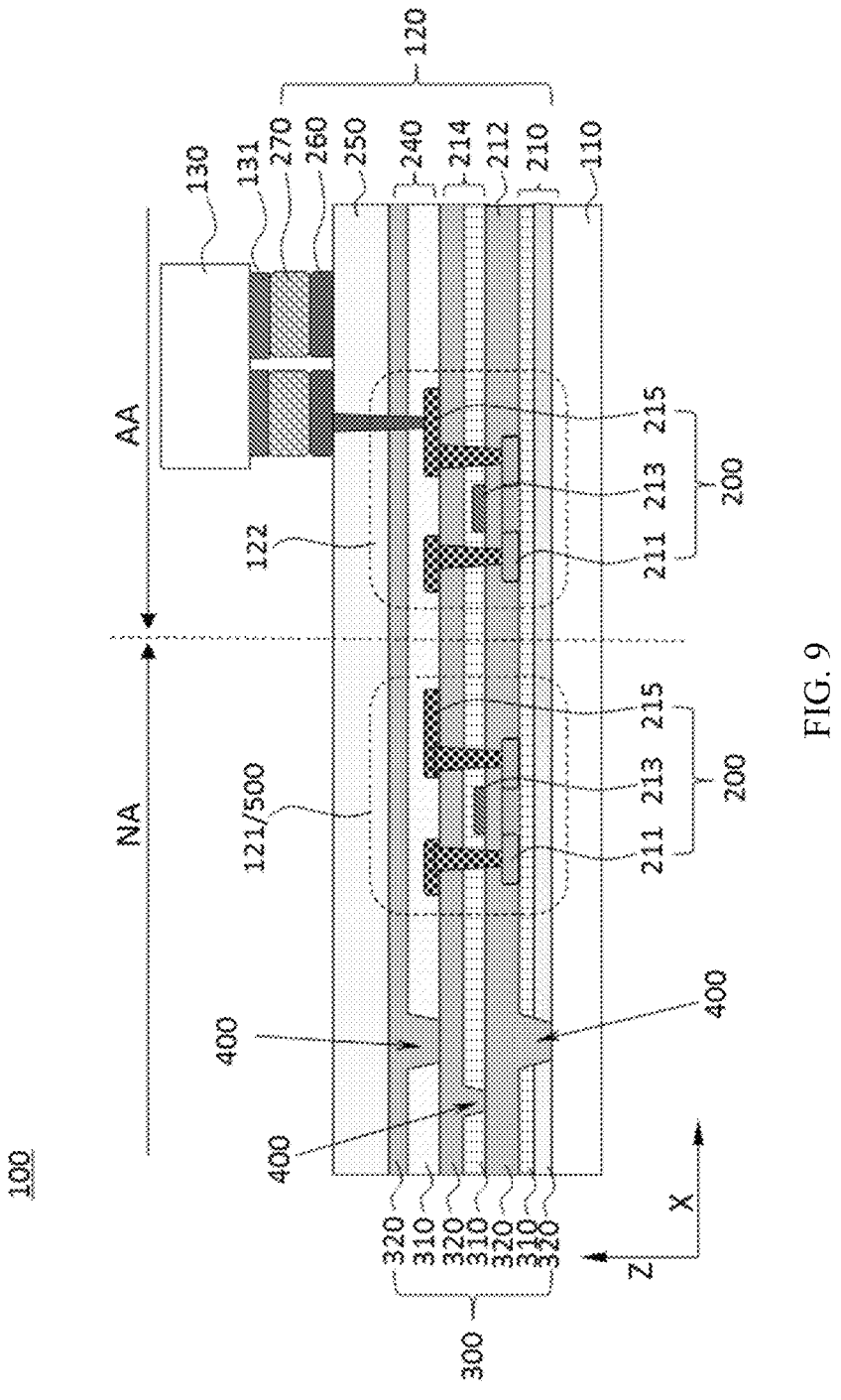
FIGS. 9-17 illustrate cross-sectional schematics of display panels along a first direction according to various embodiments of the present disclosure.

In some optional embodiments of the present application, optionally, the second insulating layer adjacent to the first insulating layer 310 may fill the groove 400 of the first insulating layer, such that the second insulating layer 320 may be in contact with the sidewall of the groove 400 (i.e., the end surface of the first insulating layer 310) and the bottom of the groove 400 (i.e., the film layer under the first insulating layer 310), as shown in any embodiments in FIG. 1 and FIG. 9.

As shown in various embodiments in any one of FIGS. 10-17, optionally, all of the first insulating layers 310 may be disposed with grooves 400; and adjacent sub-layers of the insulating layer 300 disposed with the groove 400 may be passed through by a same groove 400. That is, the first insulating layer 310 may be a composite film layer composed of a plurality of adjacent sub-layers which are passed through by a same groove 400, and at least one groove 400 may be formed in the composite film layer formed by the plurality of first insulating layers 310.

As shown in various embodiments in any one of FIGS. 10-17, optionally, the insulating layer 300 may include a plurality of second insulating layers 320, and at least one of the plurality of second insulating layers 320 may not be disposed with the groove 400. Obviously, on the basis that at least one second insulating layer 320 is not disposed with the groove 400, certain second insulating layers 320 may be disposed with the grooves 400. Optionally, at least one second insulating layer 320 may be stacked with an adjacent first insulating layer 310 and passed through by a same groove 400. That is, at least one groove 400 may be formed in the composite film layer formed by the first insulating layer 310 and the second insulating layer 320.

As shown in various embodiments in any one of FIGS. 10 to 17, optionally, the display panel 100 may have both the first sub-groove 421 and the second sub-groove 422; the first sub-groove 421 and the second sub-groove 422 may be like two parallel lines, with the driving module 121 or the driving device 500 sandwiched between the first sub-groove 421 and the second sub-groove 422. Furthermore, both the first sub-groove 421 and the second sub-groove 422 may be filled with the first insulating layer 310. The second insulating layer 320 may be equivalent to forming a ⊏ shaped cover to cover the driving device, which may further improve the water and oxygen blocking ability of the display panel and form a pinning structure with multiple nested driving devices to improve structural stability.

Obviously, in other optional embodiments of the present application, for example, various embodiments shown in any one of the drawings in FIGS. 8-16, the insulating layer 300 may include at least two second insulating layers 320, which are respectively located on two sides of the first insulating layer 310, and the two second insulating layers may be in contact with each other through the groove.

In other words, the second insulating layers 320 may be disposed on both sides of the first insulating layer 310 along the third direction Z, forming a sandwich-like structure. In addition, the two second insulating layers 320 may be in contact with each other through the groove 400 disposed on the first insulating layer 310.

It should be noted that the two second insulating layers 320 which are in contact with each other through the groove 400 may not be necessarily stacked adjacent to the first insulating layer 310 where the groove 400 is disposed. Optionally, other insulating dielectric layers may be between the second insulating layer 320 and the first insulating layer 310, and these insulating dielectric layers may also be disposed with hollow regions corresponding to the grooves 400; or the grooves 400 may pass through all of these insulating dielectric layers till reaching the second insulating layer 320 where the groove 400 may not need to be disposed. Optionally, the above-mentioned insulating dielectric layers may also include the second insulating layer 320 where the groove 400 may need to be disposed.

Through the above-mentioned embodiments, the second insulating layer may encapsulate the first insulating layer, and may be combined with the groove to block the water and oxygen entering, which further improves the reliability of the display panel.

Referring to various embodiments shown in any one of the drawings in FIG. 8, and FIGS. 10-17, in some optional embodiments of the present application, optionally, the insulating layer 300 may include the first insulating layers 310 and the second insulating layers 320 which are alternately arranged, and the outermost layers on both sides of the insulating layer 300 may be the second insulating layers 320.

The groove 400 may pass through the non-outermost second insulating layers 320 and the first insulating layers 310.

The outermost second insulating layers 320 on both sides of the insulating layer 300 may be in contact with each other through the groove 400.

In other words, the second insulating layers 320 may be disposed on both sides of the first insulating layer 310 along the third direction Z, and the two second insulating layers 320 may be respectively located on two opposite surfaces of the insulating layer 300 along the third direction Z.

Optionally, the sides, which are away from the insulating layer 300, of the outermost second insulating layers 320 on both sides of the insulating layer 300 may be adjacent to the substrate and other organic insulating layers in the array layer 120, respectively.

Optionally, the groove 400 may be disposed with a composite film layer formed by stacking the first insulating layers 310 and the second insulating layers 320 of the insulating layer 300. Then, the composite film layer may be sandwiched by the outermost second insulating layers 320 of the insulating layer 300, and the entire insulating layer 300 may form a sandwich-like structure.

Through the above-mentioned embodiments, the entire insulating layer may be designed to block water and oxygen, and the film layers having a risk of water and oxygen entering and the interface of the film layers may be together intercepted by the groove and blocked by the second insulating layer at a same layer. The interface may refer to the end surface of the film layer formed at the groove. According to various embodiments of the present disclosure, the end surfaces of non-outermost sub-film-layers of the insulating layer may be together encapsulated by outermost second insulating layers filled in the groove. In such way, through the combination of the groove and the second insulating layer, the water and oxygen entering paths between film layers at the position having water and oxygen entering risk (e.g., the end surfaces of oxide insulating layers and non-outermost sub-film-layers) in all insulating layers may be blocked; and through encapsulation by a uniform barrier, the sidewall of the cover formed by the second insulating layer may cover a wider range, which may further improve the reliability and service lifetime of the display panel. Furthermore, the pinning effect of the second insulating layer may be better, and the structure may be more stable.

Obviously, in some optional embodiments of the present application, as shown in FIG. 9, optionally, the array layer 120 may include a plurality of grooves 400, and at least two of the grooves 400 may be located in non-adjacent layers.

Optionally, the distances between the grooves 400 at different layers and the edge of the display panel 100 may be different.

Optionally, the distances between the grooves 400 at different layers and the driving device 500 may be different. That is, the orthographic projections of the grooves 400 at different layers on the substrate 110 may not be completely consistent with each other, or the projections may not be overlapped with each other.

Optionally, the driving device 500 may be the thin film transistor 200. The thin film transistor 200 may include film layers located at different conductive layers or semiconductor layers, and the distances between the orthographic projections of all part structures of the thin film transistor 200 on the substrate 110 and the edge of the display panel 100 may be different.

Through one embodiment, the grooves 400 located at different layers may be disposed according to the components of the thin film transistor closest to the grooves. For example, the groove 400 may be disposed according to the positions of the components of adjacent thin film transistor covered by the first insulating layer 310 which is used for forming the groove 400. Therefore, the position of the groove may be adjusted according to the devices in a particular film layer to ensure full utilization of the space of each layer; and various components of the thin film transistor may be protected more specifically.

In some optional embodiments of the present application, as shown in FIGS. 10-17, at least one sub-layer of the insulating layer 300 may cover the groove 400 to form a recess 600.

Optionally, the display panel 100 may further include the first light-blocking part 810, and at least a part of the first light-blocking part 810 may fill the recess 600.

Due to the arrangement of the groove 400 and the second insulating layer 320 being an inorganic material, the second insulating layer 320 covering the groove 400 may follow the contour of the groove 400 at the location of the groove 400 to form the recess 600; and the recessing direction of the recess 600 may be the direction pointing to the substrate 110 along the third direction Z.

The first light-blocking part 810 may fill the recess 600 and cover the sidewall of the recess 600. Therefore, along the first direction X, the driving device 500 may overlap at least a portion of the first light-blocking part 810.

Figure 10:
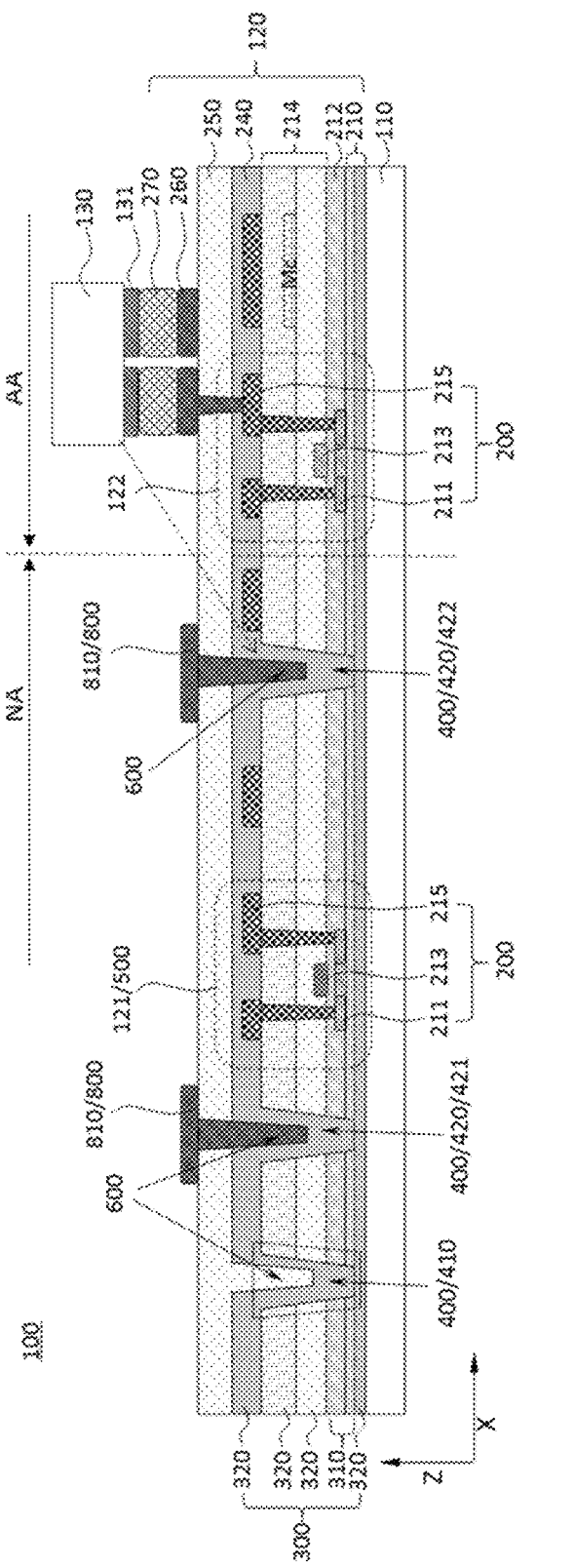

The inventor found that, unlike the OLED devices, the lateral luminous intensity of LED light-emitting elements may be high, optical waveguides may be easily formed along the horizontal direction, and when the light beam irradiates on the TFT in the VSR region, the output signal multi-pulse phenomenon may be likely to occur which affects the display effect. The dashed line in FIG. 10 is a schematic of the path of the light emitted from the light-emitting device 130. Through one embodiment, the groove may be used to block water and oxygen; meanwhile, since the structure covering the groove is an inorganic silicon nitride material, on the one hand, the ability to block water and oxygen may be further enhanced; on the other hand, the groove and the second insulating layer may be used to form the recess, thereby providing conditions for pinning the light-blocking material on both sides of the TFT. Then, the first light-blocking part filled in the recess may block the external light from irradiating on the TFT, and prevent the multi-pulse phenomenon caused by the light irradiation from occurring in the VSR region; and the arrangement of the first light-blocking part may in turn further improve the stability of the pinning structure and the water and oxygen blocking ability.

Optionally, the groove 400 may at least include the groove 400 located between the light-emitting device 130 and the driving device 500. In such way, along the direction pointing from the light-emitting device 130 to the driving device 500, the first light-blocking part 810 may be blocked between the light-emitting device 130 and the driving device 500.

Optionally, the groove 400 may at least include the second groove 420, and the first light-blocking part 810 may fill the recess 600 corresponding to the second groove 420. In such way, the first light-blocking part 810 may be clamped on both sides of the driving device 500.

In some optional embodiments of the present application, as shown in FIGS. 11-12 and FIGS. 14-17, the first light-blocking part 810 may further include that at least the orthographic projection of a part of the first light-blocking part 810 on the substrate 110 overlaps the orthographic projection of the driving device 500 on the substrate 110.

Optionally, the first light-blocking part 810 filled in the recess 600 and the first light-blocking part 810 covering and blocking the driving device 500 may be a continuous single-piece structure. In such way, the light-blocking part may block both the light emitted from the LED and the external ambient light, thereby preventing the multi-pulse phenomenon caused by the light irradiation from occurring in the VSR region.

Optionally, two types of grooves, that is, the groove between the edge of the display panel and the driving device and the groove between the light emitting device and the driving device, may both be disposed in the display panel 100 according to various embodiments of the present disclosure. Therefore, two types of recesses may also be included respectively correspond to the above-mentioned two types of grooves. The projections of one type of recesses along the third direction Z may be located between the edge of the display panel and the driving device; and the projections of another type of recesses along the third direction Z may be located between the light emitting device and the driving device. All of the first light-blocking parts may fill the above-mentioned two types of recesses, and may be connected with each other through the part of the first light-blocking parts covering and blocking the driving device to form a continuous structure. In the cross-section in parallel with the first direction X and the third direction Z, the first light-blocking part may be a ⊏ shaped frame to cover the driving device. In other words, the film material RE above the VSR region may be a non-transparent material, which has a light-blocking effect on the TFT in the VRS region to eliminate the influence of external light on the characteristics of the TFT device.

Obviously, in some optional embodiments of the present application, the grooves disposed in the first insulating layer 310 may be one or a combination of the first groove, the first sub-groove, and the second sub-groove. The recesses may be disposed respectively corresponding to one or more of these grooves as required, and the first light-blocking parts may need to be disposed respectively corresponding to recesses formed by one or more of different grooves.

Figure 11:
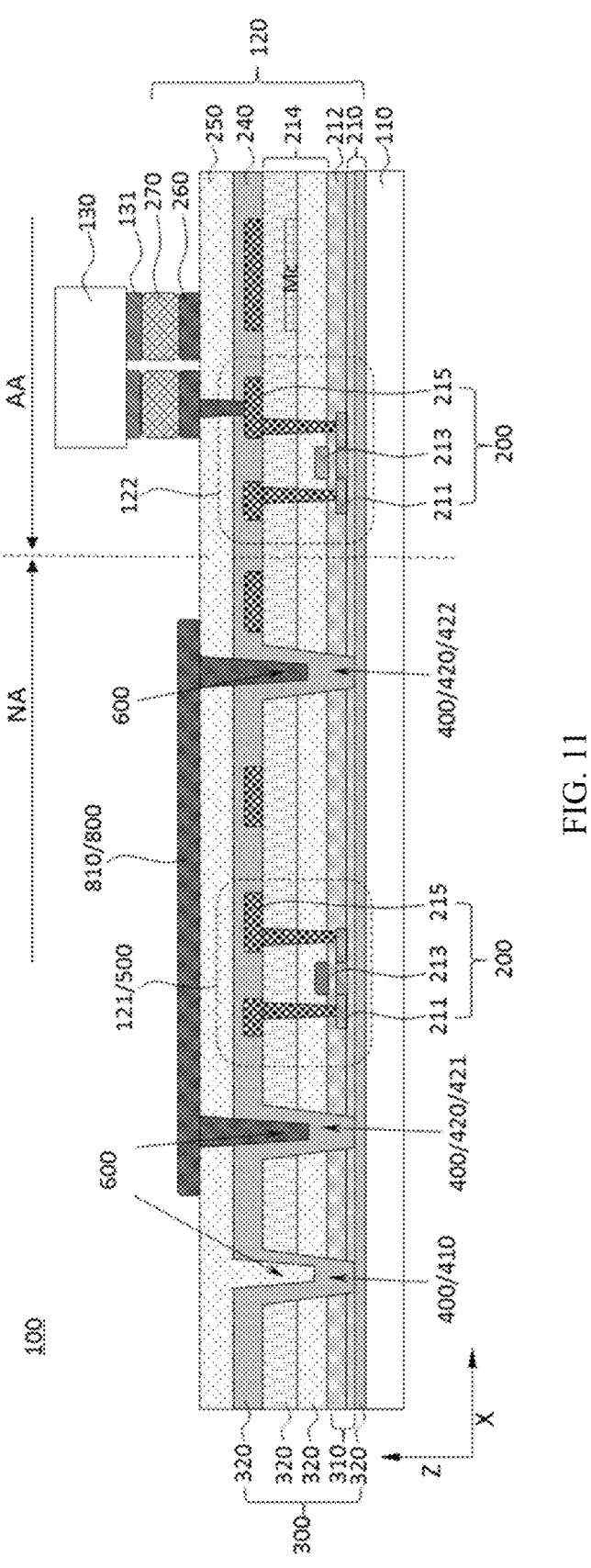
Figure 14:
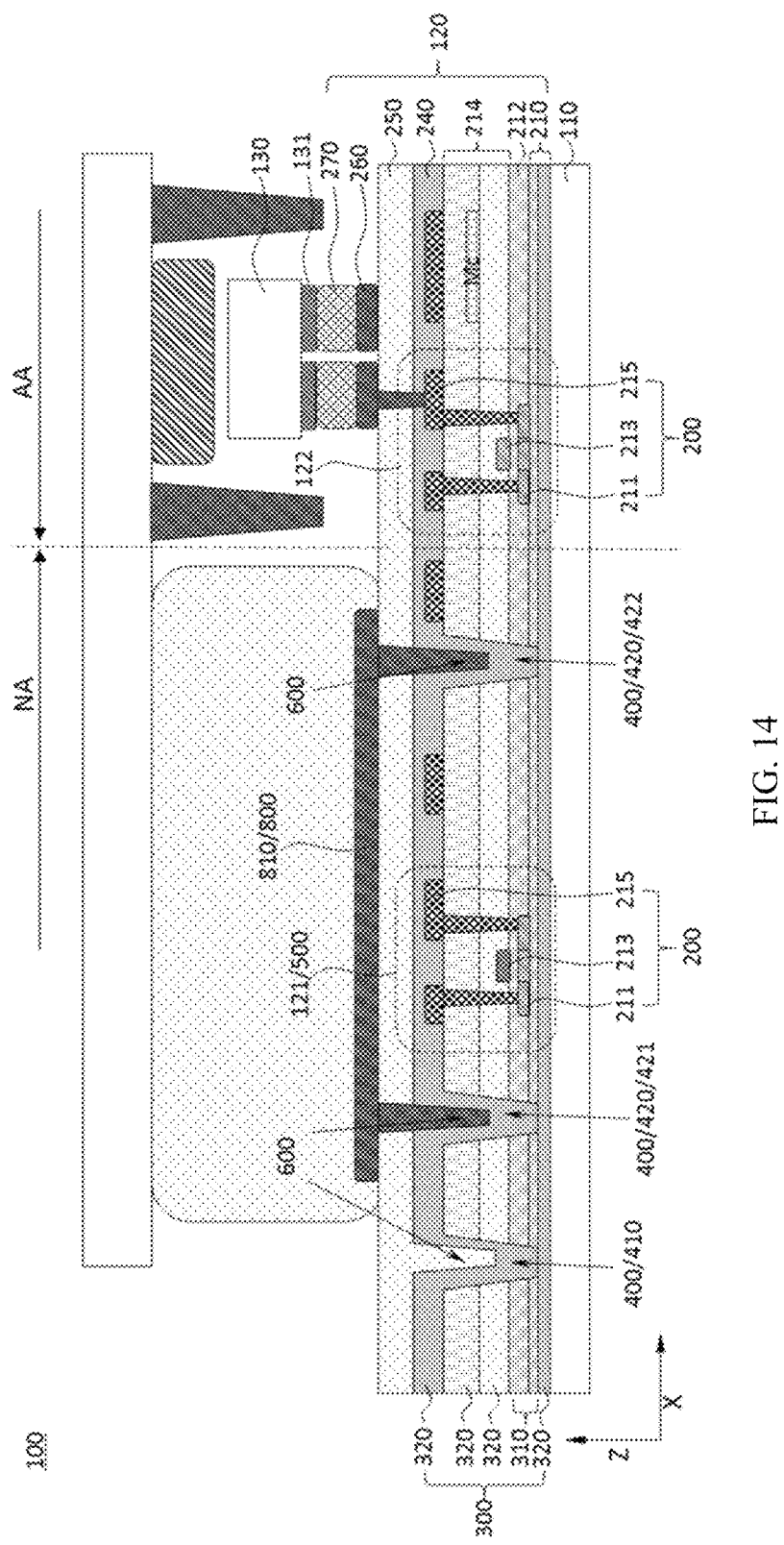
Figure 16:
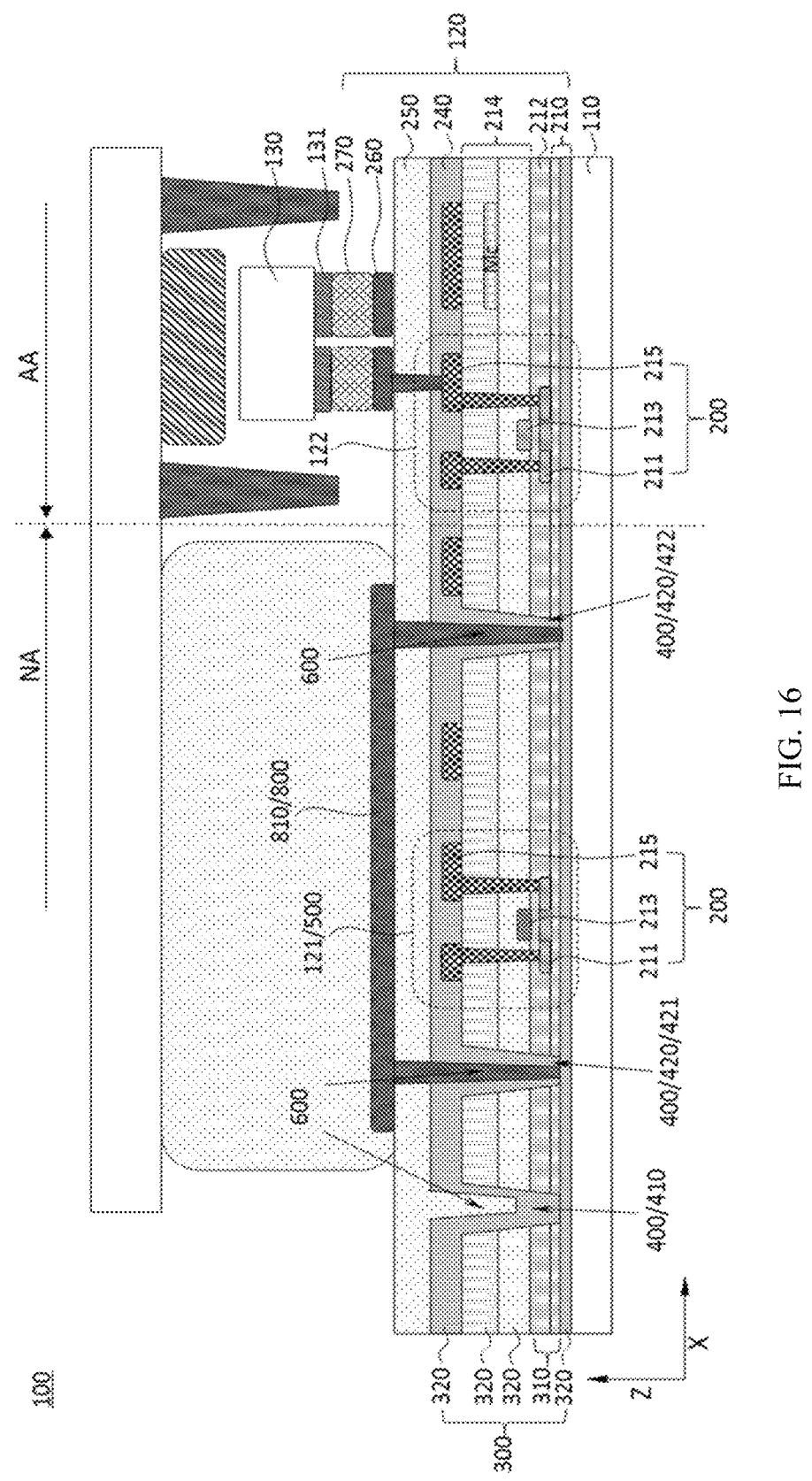

For example, as shown in FIGS. 11, 14, and 16, the display panel 100 may include the first groove 410, the first sub-groove 421, and the second sub-groove 422; the first light-blocking part may not be disposed in the recess corresponding to the first groove 410; and the first light-blocking parts may be disposed in the recesses corresponding to the second sub-groove 421 and the second sub-groove 422, thereby reducing the frame width of the display panel through such design.

Figure 12:
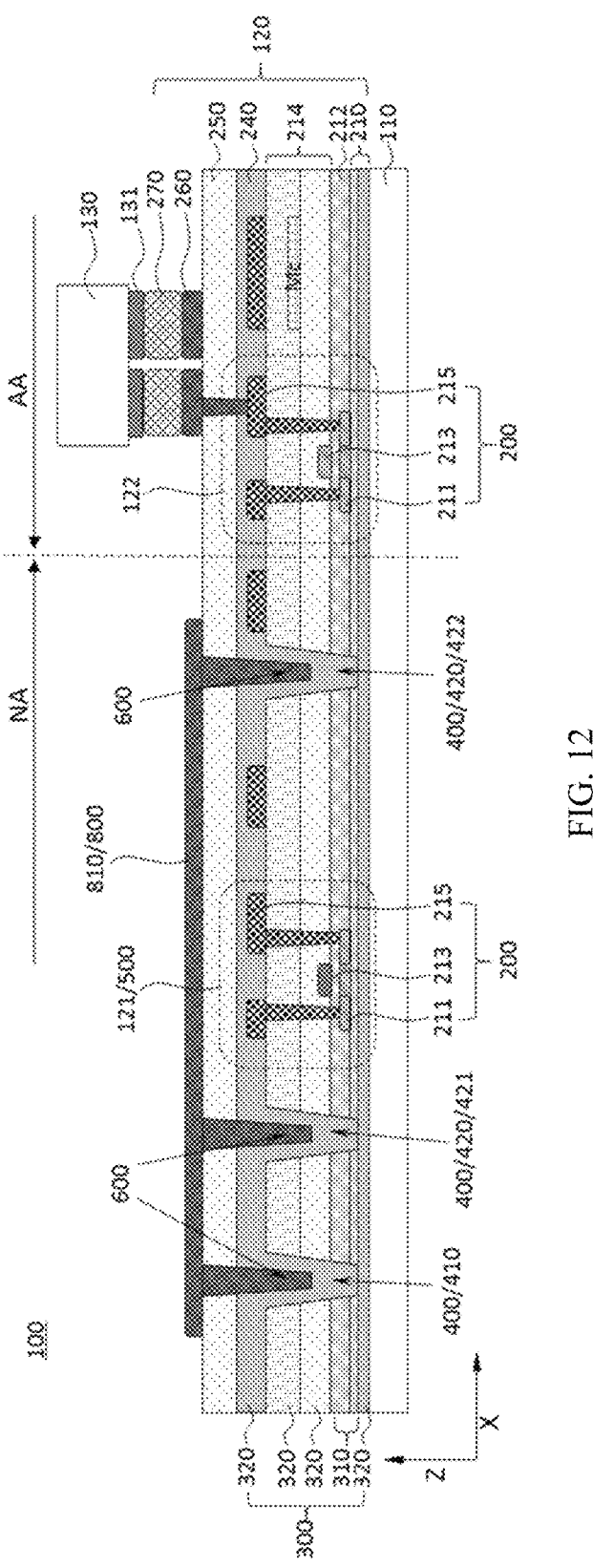
Figure 15:
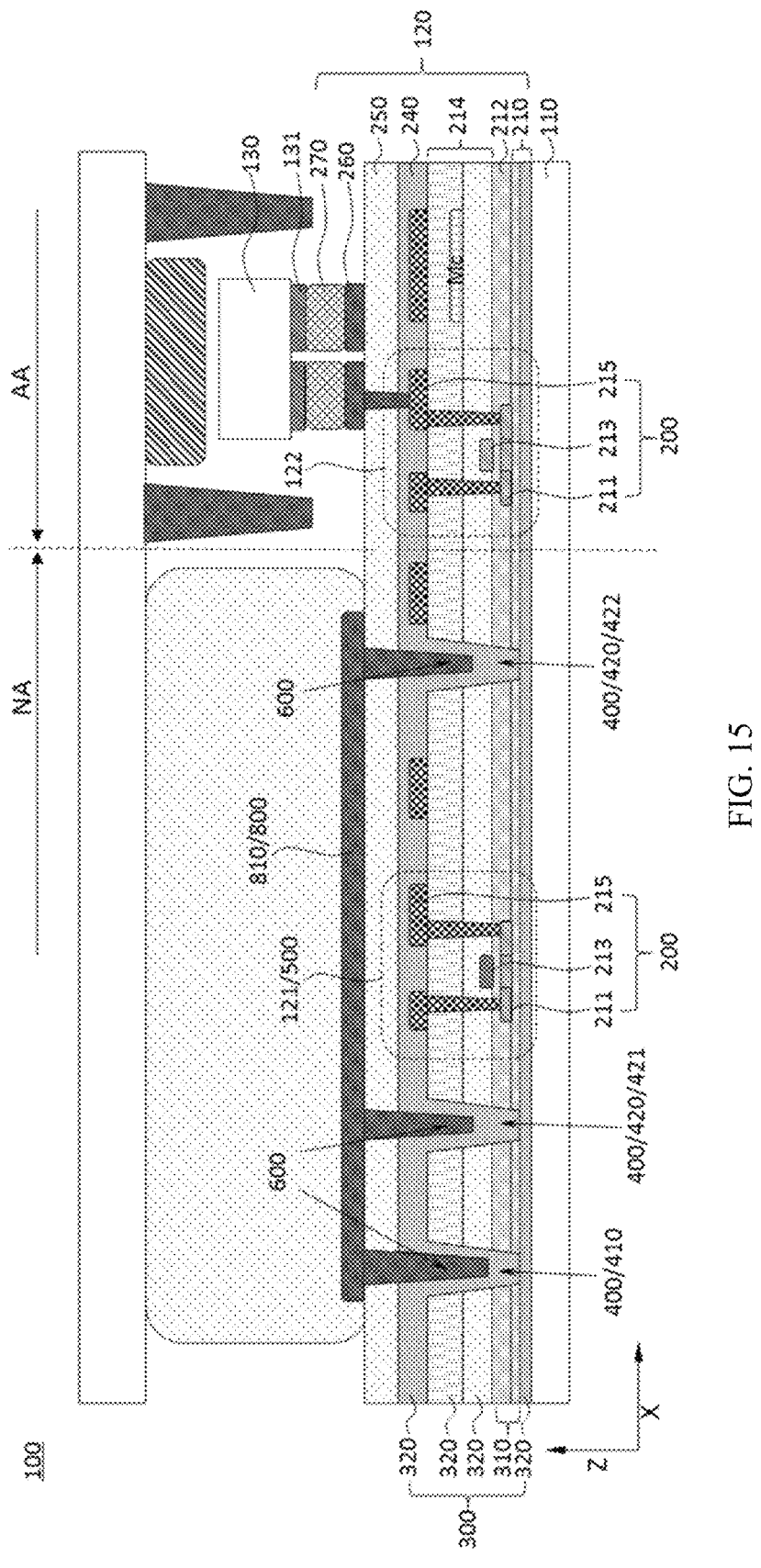

For another example, as shown in FIGS. 12 and 15, the display panel 100 may include the first groove 410, the first sub-groove 421, and the second sub-groove 422; and the first light-blocking parts may be disposed in the recesses corresponding to the first groove 410, the first sub-groove 421, and the second sub-groove 422. Furthermore, any one of the drawings in FIG. 12 and FIG. 15 may be understood in combination with FIG. 18. The relevant design in one embodiment shown in FIG. 18 may refer to the following description.

In some optional embodiments of the present application, the first light-blocking part may be at a same layer as the metal layer on the array layer. That is, the first light-blocking part may be formed by multiplexing the existing film layer or manufacturing process in the array layer. For example, referring to various embodiments shown in any one of FIGS. 1-17, the first light-blocking part 810 and the connection electrode 260 may, at a same layer, be made of a same material.

Optionally, the first light-blocking part 810 may be a film layer including metal, that is, an RE layer.

Optionally, the material of the first light-blocking part 810 and the connection electrode 260 may be a non-transparent material layer formed by a PVD process.

Optionally, the first light-blocking part 810 and the connection electrode 260 may be material layers including indium-tin-oxide-silver-indium-tin-oxide (ITO—Ag—ITO), or titanium-aluminum-titanium (Ti—Al—TI), or molybdenum-aluminum-molybdenum (Mo—Al—Mo), and/or any suitable material(s).

Through one embodiment, other film layers in the display panel may be used to jointly form the light-blocking parts, which may simplify the formation process, reduce the cost and also be beneficial for the thinning of the display panel.

Furthermore, as shown in FIGS. 14 to 17, the display panel 100 may further include a cover plate disposed opposite to the array layer 120. Optionally, the cover plate may be made of a glass material. The cover plate may be attached to the array layer 120 by an adhesive material, such that the light-emitting device 130 may be protected between the cover plate and the array layer 120. Optionally, the adhesive material may be a transparent optical adhesive OCA. Optionally, the adhesive material may cover or encapsulate the first light-blocking part.

Through one embodiment, other film layers in the display panel may be used to jointly form the light-blocking part, which may simplify the formation process, reduce the cost and also be beneficial for the thinning of the display panel. In addition, the film layer where the connection electrode is located is one of the outermost metal layers of the array layer. Since the first light-blocking part is multiplexed as the film layer where the connection electrode is located, the first light-blocking part may be protected by the adhesive material used to bind the cover plate and the array layer, thereby preventing the first light-blocking part from being oxidized or corroded.

Figure 13:
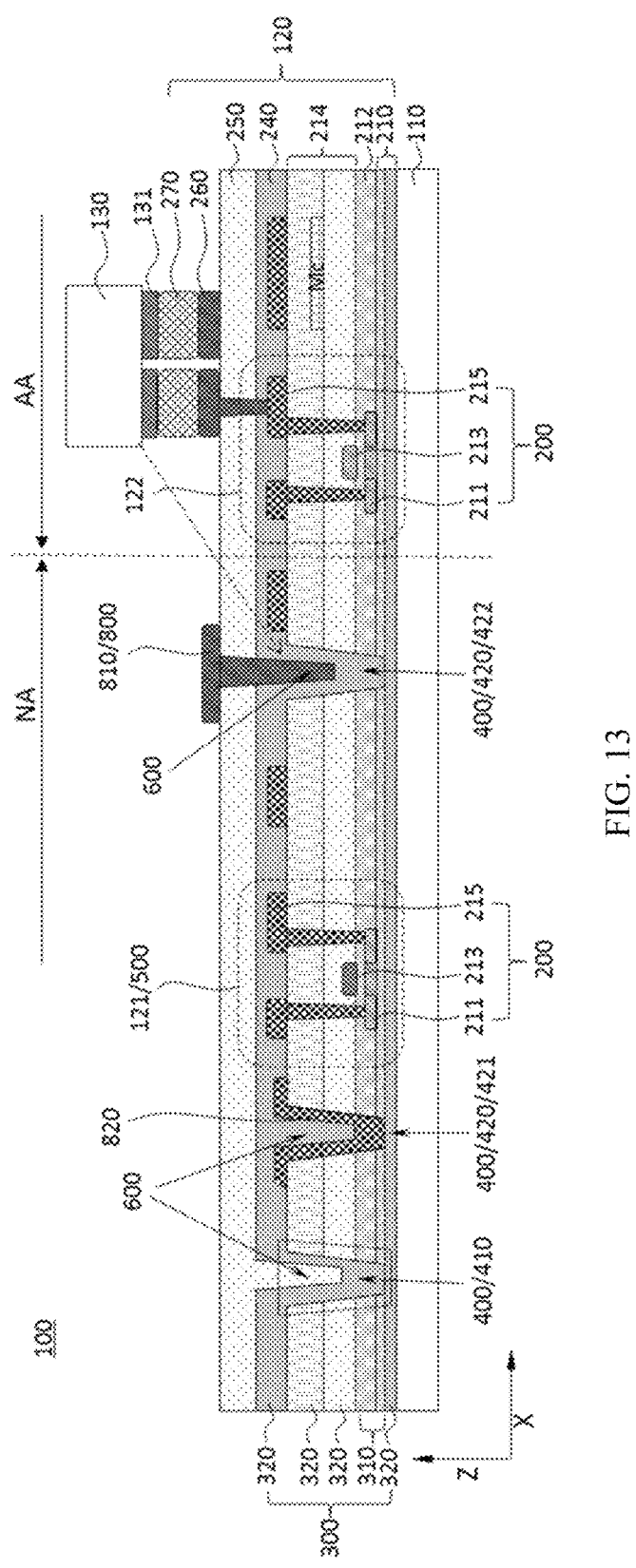

Obviously, in some optional embodiments of the present application, as shown in FIG. 13, the display panel 100 may further include a second light-blocking part 820, and the second light-blocking part 820 may be disposed in the groove 400.

Optionally, the second light-blocking part 820 may cover at least the sidewall of the groove 400. Furthermore, the second light-blocking part 820 may cover both the sidewall and bottom of the groove 400, and may be directly in contact with the sidewall and bottom of the groove 400.

Optionally, the second light-blocking part 820 may be at a same layer and made of a same material as other functional layers with the light-blocking capability in the array layer 120. For example, the second light-blocking part may be at a same layer and made of a same material as the gate electrode metal layer or the source/drain layer.

Optionally, other insulating layers in the display panel may cover the groove and the second light-blocking part.

Optionally, at least one second insulating layer 320 may fill the groove 400 and cover the second light-blocking part 820.

Through one embodiment, while improving the light-blocking performance, a barrier layer with double layer materials may also be formed, which may further improve the ability to block water and oxygen entering, simplify the formation process, reduce the cost and also be beneficial for the thinning of the display panel.

Figure 17:
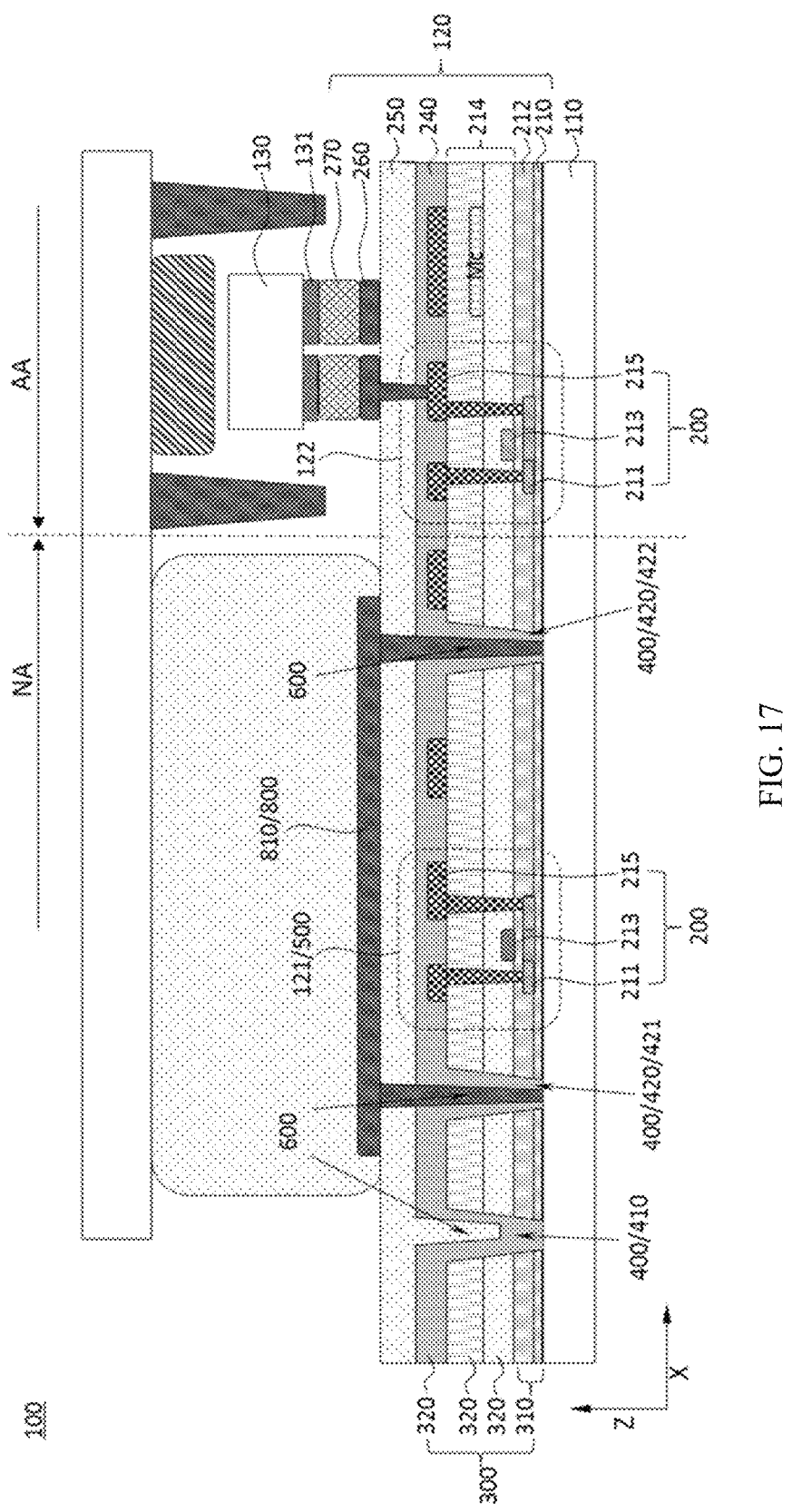

Referring to FIG. 16 and FIG. 17, optionally, the second insulating layer 320 may include a hollow exposing the bottom of the groove 400. However, the second insulating layer 320 may at least cover the sidewall of the groove 400, that is, the position where the sidewall of the groove 400 is joined with the substrate 110. In such way, the first insulating layer may be sealed to improve the blocking ability to water and oxygen entering, and a better light blocking effect may be achieved, such that the light-blocking layer may surround the driving device as possible and a more stable pinning structure may be implemented.

As shown in FIG. 17, optionally, the groove 400 may be disposed to directly expose the substrate, and the second insulating layer 320 may be in contact with the substrate 110 through the groove 400, such that the light-blocking effect and the stability of the pinning structure may be further improved.

Figure 18:
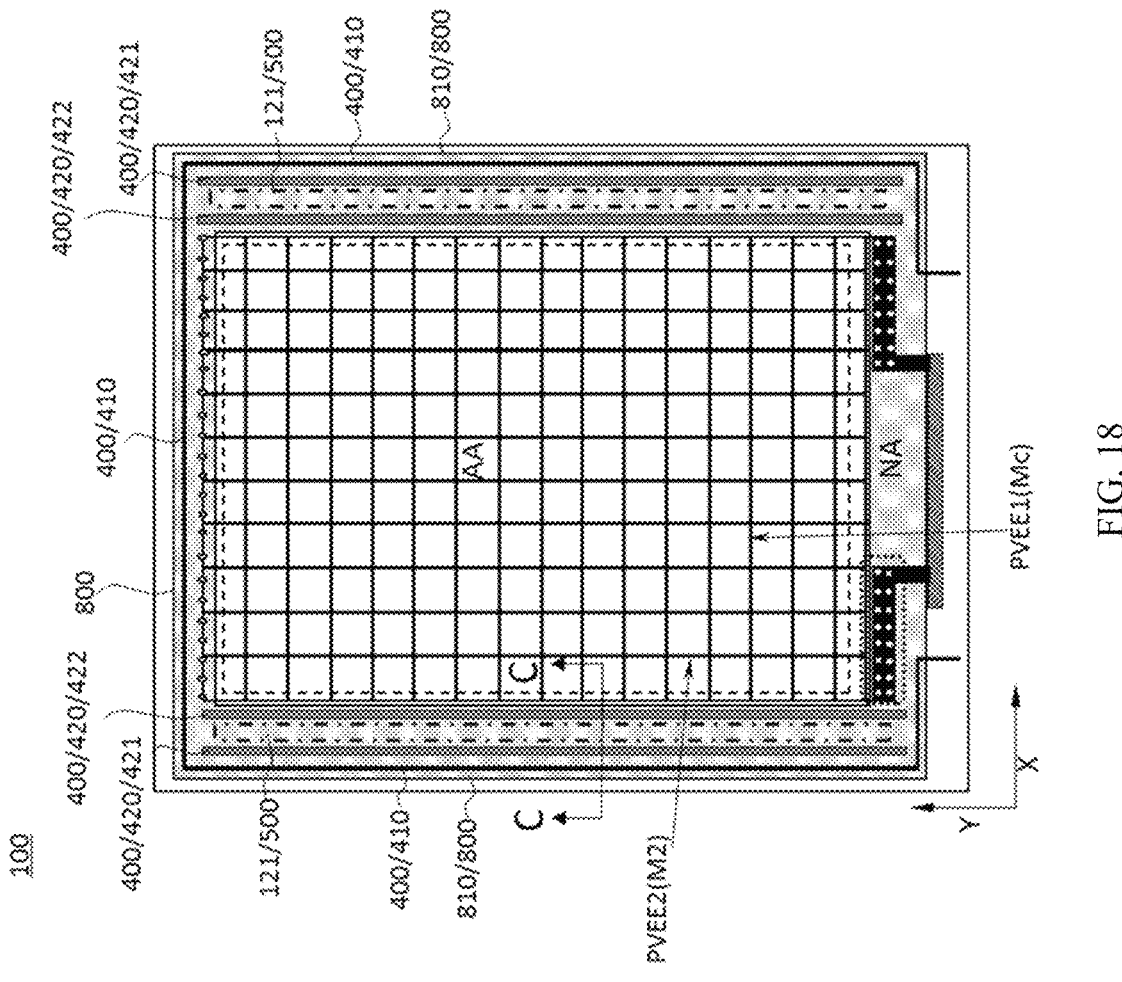
FIG. 18 illustrates a schematic of another display panel according to various embodiments of the present disclosure.

Referring to FIG. 18, FIG. 18 illustrates a schematic of another display panel according to various embodiments of the present disclosure. FIG. 18 may be understood in conjunction with any one of FIGS. 10-17. FIGS. 10-17 may be understood as a plurality of different cross-sectional views taken along the C-C cross-sectional line of FIG. 18, respectively.

The display panel 100 may further include the first power signal line PVEE and the auxiliary conductive portion 800 that are electrically connected with each other.

For example, the connection electrode 260 of the display panel 100 may include a first connection electrode and a second connection electrode respectively corresponding to two electrodes in the electrode layer 131 of the light-emitting device 130. For the first connection electrode and the second connection electrode, one of these electrodes may provide a positive power supply voltage signal for the light-emitting device 130, and the other of these electrodes may provide a negative power supply voltage signal for the light-emitting device 130. The signal line that provides the negative power supply voltage signal for the connection electrode may be the first power supply signal line PVEE.

Optionally, the first power signal line PVEE may include a first-portion wiring PVEE1 extending along the first direction X and a second-portion wiring PVEE2 extending along the second direction Y; and the projections of the first-portion wirings PVEE1 and the second-portion wirings PVEE2 on the substrate may cross over to form a meshed structure.

Optionally, the first-portion wiring PVEE1 and the second-portion wiring PVEE2 may be at different film layers, respectively.

Optionally, the first-portion wiring PVEE1 may be located at a capacitor layer Mc, which is at a same layer and made of a same material as the capacitor electrode in the array layer 120; and the second-portion wiring PVEE2 may be located at a second metal layer M2, which is at a same layer and made of a same material as the source/drain electrode layer 215. The first metal layer M1 may be the film layer where the gate electrode 213 is located.

Optionally, the first-portion wiring PVEE1 and the second-portion wiring PVEE2 may be connected by a via on the insulating layer, which is between the first-portion wiring PVEE1 and the second-portion wiring PVEE2, at the overlapped position between the first-portion wiring PVEE1 and the second-portion wiring PVEE2, thereby reducing the resistance of the first power signal line PVEE.

Optionally, the connection position of the first-portion wiring PVEE1 and the second-portion wiring PVEE2 may be located at the non-display region.

Optionally, the auxiliary conductive portion 800 may be located at the non-display region NA.

Optionally, the auxiliary conductive portion 800 and the connection electrode 260 may be at a same layer and made of a same material.

Optionally, the auxiliary conductive portion 800 may be a film layer including metal, that is, an RE layer.

Optionally, the material of the auxiliary conductive portion and the connection electrode 260 may be a non-transparent material layer formed by a PVD process.

Optionally, the auxiliary conductive portion and the connection electrode 260 may be material layers including indium-tin-oxide-silver-indium-tin-oxide (ITO—Ag—ITO), or titanium-aluminum-titanium (Ti—Al—TI), or molybdenum-aluminum-molybdenum (Mo—Al—Mo), and/or any suitable material(s).

Optionally, the first power signal line PVEE and the auxiliary conductive portion 800 may be connected with each other through a via in the passivation layer (PV) 240 and the planarization layer (PLN) 250.

By disposing the auxiliary conductive portion 800 and connecting the first power signal line PVEE and the auxiliary conductive portion 800 in parallel with each other, the resistance of the first power signal line PVEE may be reduced.

Optionally, the orthographic projection of the auxiliary conductive portion 800 on the substrate may overlap the orthographic projection of the driving device 500 on the substrate; and/or the orthographic projection of the auxiliary conductive portion 800 on the substrate may overlap the orthographic projection of the groove 400 on the substrate.

For example, due to the arrangement of the groove 400 and the second insulating layer 320 being an inorganic material, the second insulating layer 320 covering the groove 400 may follow the contour of the groove 400 at the location of the groove 400 to form the recess 600; and the recessing direction of the recess 600 may be the direction pointing to the substrate 110 along the third direction Z. At least a part of the auxiliary conductive portion 800 may fill the recess 600 to be conformed to the contour of the recess at the position covering the recess 600. In such way, the dimension of the auxiliary conductive portion 800 along the first direction X may be increased, the resistance thereof may be reduced, and the resistance of the first power signal line PVEE may be further reduced. In other words, the groove may reduce the resistance of the first power signal line while increasing the water and oxygen blocking.

Optionally, the auxiliary conductive portion 800 may be a light-blocking material.

Optionally, the first light-blocking part 810 may be multiplexed as the auxiliary conductive portion 800. Therefore, the design of the auxiliary conductive portion 800 in one embodiment may refer to the above-mentioned description of the first light-blocking part 810, which may not be described in detail herein.

For example, any one of the drawings in FIG. 12 and FIG. 15 may be understood in combination with FIG. 18. The display panel 100 may include the first groove 410, the first sub-groove 421, and the second sub-groove 422; and the recesses corresponding to the first groove 410, the first sub-groove 421, and the second sub-groove 422 may be disposed with auxiliary conductive portions 800. In such way, the size of the auxiliary conductive portion 800 along the first direction X may be increased, the resistance thereof may be reduced, and the resistance of the first power signal line PVEE may be further reduced.

Through the above-mentioned design, the film structure may be simplified, and the impact of external ambient light on the TFT device may be avoided while reducing the PVEE resistance.

Optionally, the first power signal line PVEE and the auxiliary conductive portion 800 may be connected with each other through a via in the passivation layer (PV) 240 and the planarization layer (PLN) 250; and the via may be located on the side of the second sub-groove 422 of the groove 400 away from the driving device 500. Optionally, the groove 400 may include the second sub-groove 422 located between the connection junction, which is between the first power signal line PVEE and the auxiliary conductive portion 800, and the driving device 500.

Through such design, while ensuring the resistance reduction for the first power signal line PVEE, it is possible to avoid the influence of water and oxygen introduced by the via in the passivation layer (PV) 240 and the planarization layer (PLN) 250 on the driving device.

In some optional embodiments of the present application, any one of the drawings in FIG. 10 to FIG. 17 may be understood in combination with FIG. 18. Optionally, the display panel 100 may include the display region AA and the non-display region NA surrounding the display region AA.

The non-display region NA may include first regions each being located at one of two sides of the display region along the first direction X and second regions each being located at one of two sides of the display region along the second direction Y; and the driving device 500 may be located in the first region.

The display panel 100 may further include the first power signal line PVEE and the auxiliary conductive portion 800. The similarities between the first power signal line PVEE and the auxiliary conductive portion 800 and the above-mentioned embodiment may not be described in detail herein; and the difference may be that the first power signal line may be electrically connected to the auxiliary conductive portion through a via located in the second region. For example, the dots in the region shown by the rounded rectangular dashed frame in FIG. 18 may be the vias in the second region which may enable the first power signal line to be connected with the auxiliary conductive portion.

In other words, in the VSR region of the panel, the connection vias for PV and PLN of PVEE may not be disposed, and the PVEE connection vias may be disposed in the upper and lower regions of the panel. PLN and PV may prevent external water and oxygen from entering the VSR circuit, which may be used to improve the corrosion resistance of the panel and increase the service lifetime. In addition, the first power signal lines PVEE of the micro LED back panel may have a mesh distribution in the AA region, such that the PV and PLN connection vias of PVEE may not be disposed in the VSR region, which may have the negligible influence on the resistance.

Optionally, the orthographic projection of the auxiliary conductive portion 800 on the substrate may be a circular shape surrounding the display region AA. That is, the auxiliary conductive portion 800 may cover both the first region and the second region.

That is, the auxiliary conductive portion 800 may be a circular shape surrounding the display region AA. Optionally, the auxiliary conductive portion 800 may have a closed circular shape surrounding the display region AA.

The inventor found that for the OLED display panel, the encapsulation layer must be disposed above the OLED device, and the encapsulation layer may a desirable function of blocking $H_2O/O_2$; however, the micro LED device itself does not need to be encapsulated, and the PV and PLN connection vias of PVEE may be directly disposed at the VSR region to reduce the resistance of PVEE, which may cause the PV and PLN connection vias of PVEE to be easily affected by water and oxygen and also result in abnormal operation or even failure of the surrounding VSR. Therefore, the design in the above-mentioned embodiments of the present application may reduce the resistance of PVEE and improve the uniformity of the display surface, while avoiding water and oxygen entering to the VSR and improving the lifetime of the VSR in the display panel.

Through one embodiment, while taking into account the technical effects in the above-mentioned embodiments, on the one hand, it may avoid the conflict between the structure for reducing PVEE resistance and the structure formed by the groove to prevent water and oxygen entering; on another hand, it is possible to avoid the vias in the passivation layer (PV) 240 and the planarization layer (PLN) 250 from being close to the VSR to avoid introducing water and oxygen entering paths; and on another hand, the frame width of the display panel may be reduced.

Figure 19:
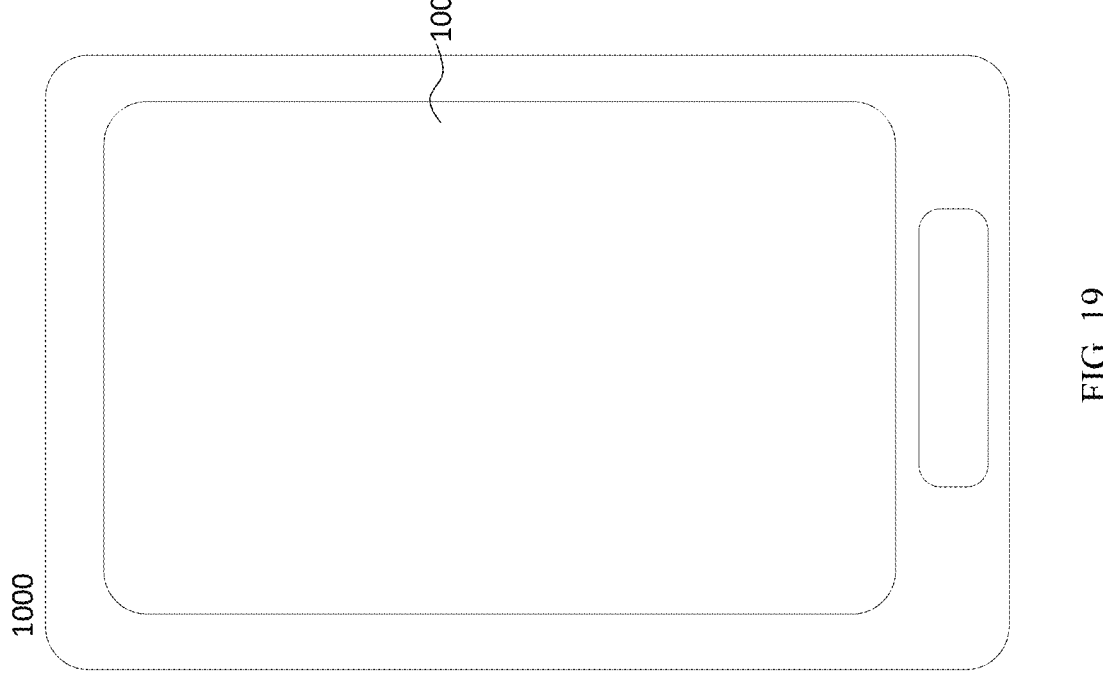
FIG. 19 illustrates a schematic of a display device according to various embodiments of the present disclosure.

The present disclosure also provides a display device, including the display panel provided by the present disclosure. As shown in FIG. 19, FIG. 19 illustrates a schematic of a display device according to various embodiments of the present disclosure. A display device 1000 may include the display panel 100 provided by any one of the above-mentioned embodiments of the present disclosure. The embodiment of FIG. 19 may only use a mobile phone as an example to illustrate the display device 1000. It can be understood that the display device provided in various embodiments of the present disclosure may be a computer, a television, a vehicle-mounted display device, and other display device with a display function, which may not be limited according to various embodiments of the present disclosure. The display device provided by various embodiments of the present disclosure may have the beneficial effects of the display panel provided by various embodiments of the present disclosure. Details may refer to the description of the display panel in the above-mentioned embodiments, which may not be described in detail herein.

The above may be a further detailed description of the present disclosure in conjunction with optional embodiments, and may not be considered that the implementation manners of the present disclosure are limited to such descriptions. For those skilled in the technical field of the present disclosure, under the premise of not departing from the concept of the present disclosure, multiple simple deductions or substitutions may be made, all of which shall be regarded as within the protection scope of the present disclosure.

What is claimed is:

1. A light-emitting diode (LED) display panel, comprising:
   a substrate;
   an array layer, at a side of the substrate; and
   a light-emitting device, at a side of the array layer away from the substrate, wherein:
      the display panel includes a display region including an array of pixels and a non-display region adjacent to an edge of the display panel and surrounding all of the pixels in the display region;
      the array layer includes an insulating layer and a driving device, the driving device including a thin film transistor in a signal driving circuit;
      the insulating layer includes a plurality of grooves in the non-display region;
      the plurality of grooves include a second sub-groove disposed in the non-display region and between the driving device and a pixel circuit for the light-emitting element, the light-emitting element is electronically connected to the pixel circuit in the display region, wherein the pixel circuit overlaps with the light-emitting element along a direction perpendicular to the substrate, and the driving device does not overlap with any light-emitting element along the direction perpendicular to the substrate, and
      the plurality of grooves further include a different first groove and a different first sub-groove disposed between the edge of the display panel and the driving device, the first sub-groove and the second sub-groove being disposed on two opposite sides of the driving device along a direction from the edge of the display panel towards the light-emitting element, and bottoms of the first sub-groove and the second sub-groove are all in direct contact with the substrate to expose the substrate.

2. The display panel according to claim 1, wherein:
   the insulating layer includes at least one first insulating layer and at least one second insulating layer; and
   the first insulating layer is made of oxide, and the second insulating layer is made of nitride.

3. The display panel according to claim 2, wherein:
   the first insulating layer is made of silicon oxide; and the second insulating layer is made of silicon nitride.

4. The display panel according to claim 2, wherein:
   an outermost layer, of the at least one first insulating layer and at least one second insulating layer, away from the substrate is a second insulating layer; and
   the outermost second insulating layer fills the first groove.

5. The display panel according to claim 2, wherein:
   the insulating layer includes at least two second insulating layers, the first insulating layer is sandwiched between two second insulating layers of the at least two second insulating layers, and the at least two second insulating layers are in contact with each other through the first groove.

6. The display panel according to claim 2, wherein:
   the first groove passes through at least one non-outermost layer included in the insulating layer.

7. The display panel according to claim 1, wherein:

the array layer includes a plurality of grooves, and at least two of the plurality of grooves are at non-adjacent insulating layers.

8. The display panel according to claim 2, wherein:

at least one sub-layer of the insulating layer covers the first groove to form a recess;

the display panel further includes a first light-blocking part; and at least a portion of the first light-blocking part fills the recess.

9. The display panel according to claim 8, wherein:

an orthographic projection of the at least the portion of the first light-blocking part on the substrate overlaps an orthographic projection of the driving device on the substrate.

10. The display panel according to claim 8, wherein:

a metal layer is formed on the array layer using a same material in a same single process as for forming the first light-blocking part.

11. The display panel according to claim 2, wherein:

the first groove is disposed with a second light-blocking part.

12. The display panel according to claim 2, further including:

a first power signal line and an auxiliary conductive portion which are electrically connected with each other, wherein:

an orthographic projection of the auxiliary conductive portion on the substrate overlaps an orthographic projection of the driving device on the substrate; and/or the orthographic projection of the auxiliary conductive portion on the substrate overlaps an orthographic projection of the first groove on the substrate.

13. The display panel according to claim 1, wherein:

the non-display region includes first regions each being located at one of two sides of the display region along a first direction and second regions each being located at one of two sides of the display region along a second direction; and the driving device is at a first region;

the display panel further includes a first power signal line and an auxiliary conductive portion; and the first power signal line is electrically connected to the auxiliary conductive portion through a via at a second region.

14. The display panel according to claim 12, wherein:

the auxiliary conductive portion is made of a light-blocking material.

15. The display panel according to claim 1, wherein:

a minimum distance from an edge of the driving device to the edge of the display panel ranges from about 150 μm to about 300 μm.

16. The display panel according to claim 2, wherein:

a minimum distance from the first groove to the edge of the display panel is greater than 100 μm.

17. A display device, comprising:

a light-emitting diode (LED) display panel, comprising:

a substrate;

an array layer, at a side of the substrate; and a light-emitting device, at a side of the array layer away from the substrate, wherein:

the display panel includes a display region including an array of pixels and a non-display region adjacent to an edge of the display panel and surrounding all of the pixels in the display region;

the array layer includes an insulating layer and a driving device, the driving device including a thin film transistor in a signal driving circuit;

the insulating layer includes a plurality of grooves in the non-display region;

the plurality of grooves include a second sub-groove disposed in the non-display region and between the driving device and a pixel circuit for the light-emitting element, the light-emitting element is electronically connected to the pixel circuit in the display region, wherein the pixel circuit overlaps with the light-emitting element along a direction perpendicular to the substrate, and the driving device does not overlap with any light-emitting element along the direction perpendicular to the substrate; and the plurality of grooves further include a different first groove and a different first sub-groove disposed between the edge of the display panel and the driving device, the first sub-groove and the second sub-groove being disposed on two opposite sides of the driving device along a direction from the edge of the display panel towards the light-emitting element, and bottoms of the first sub-groove and the second sub-groove are all in direct contact with the substrate to expose the substrate.

\* \* \* \* \*